(12) United States Patent
Lee et al.

(10) Patent No.: US 11,871,529 B2
(45) Date of Patent: Jan. 9, 2024

(54) DISPLAY DEVICE

(71) Applicant: LG Display Co., Ltd., Seoul (KR)

(72) Inventors: SeungHee Lee, Goyang-si (KR); MiJin Han, Gimpo-si (KR); Hanul Lee, Seoul (KR); Hyosung Lee, Gwangmyeong-si (KR)

(73) Assignee: LG DISPLAY CO., LTD., Seoul (KR)

( * ) Notice: Subject to any disclaimer, the term of this patent is extended or adjusted under 35 U.S.C. 154(b) by 233 days.

(21) Appl. No.: 17/411,964

(22) Filed: Aug. 25, 2021

(65) Prior Publication Data
US 2022/0078934 A1 Mar. 10, 2022

(30) Foreign Application Priority Data

Sep. 8, 2020 (KR) .................. 10-2020-0114629

(51) Int. Cl.
| | | |
|---|---|---|
| *H05K 5/02* | (2006.01) | |
| *H05K 5/00* | (2006.01) | |
| *H05K 1/18* | (2006.01) | |
| *H05K 1/14* | (2006.01) | |
| *H10K 50/84* | (2023.01) | |
| *H05K 5/03* | (2006.01) | |

(52) U.S. Cl.
CPC ......... *H05K 5/0226* (2013.01); *H05K 5/0017* (2013.01); *H10K 50/841* (2023.02); *H05K 1/147* (2013.01); *H05K 1/189* (2013.01); *H05K 5/03* (2013.01); *H05K 2201/056* (2013.01); *H05K 2201/10128* (2013.01)

(58) Field of Classification Search
CPC ...................................................... H05K 5/00
See application file for complete search history.

(56) References Cited

U.S. PATENT DOCUMENTS

| | | | |
|---|---|---|---|
| 9,864,412 B2 | 1/2018 | Park et al. | |
| 10,586,475 B2 | 3/2020 | Park et al. | |
| 10,798,831 B2 | 10/2020 | Shin et al. | |
| 10,936,012 B2 | 3/2021 | Kim | |
| 2007/0211036 A1* | 9/2007 | Perkins | G06F 3/0412 345/173 |
| 2020/0365063 A1* | 11/2020 | Park | G06F 1/1601 |

FOREIGN PATENT DOCUMENTS

| | | |
|---|---|---|
| KR | 10-2018-0045980 A | 5/2018 |
| KR | 10-2016-0148141 A | 12/2018 |
| KR | 10-2019-0078842 A | 7/2019 |
| KR | 10-2019-0098888 A | 8/2019 |
| KR | 10-2020-0030265 A | 3/2020 |
| KR | 10-2020-0070336 A | 6/2020 |
| KR | 10-2021-0017058 A | 2/2021 |

\* cited by examiner

*Primary Examiner* — Jerry Wu
(74) *Attorney, Agent, or Firm* — Birch, Stewart, Kolasch & Birch, LLP

(57) ABSTRACT

A display device can include a display panel, a roller which guides the sliding of the display panel, a rotary shaft which passes through both ends of the roller, and an elastic member having one end connected to an inner circumferential surface of the roller and the other end connected to the rotary shaft, and the roller and the rotary shaft are rotatably connected to each other. Accordingly, according to the present disclosure, one end and the other end of the elastic member are configured to be rotatable to minimize the excessive increase of the tensile stress of the elastic member which is transmitted to the display panel and improve the reliability of the display panel.

10 Claims, 24 Drawing Sheets

DISPLAY DEVICE

CROSS-REFERENCE TO RELATED APPLICATIONS

This application claims the priority of Korean Patent Application No. 10-2020-0114629 filed on Sep. 8, 2020, in the Korean Intellectual Property Office, the disclosure of which is incorporated herein by reference into the present application.

BACKGROUND

Field

The present disclosure relates to a display device, and more particularly, to a slidable display device which is slidably accommodated in a housing unit or exposed to the outside of the housing unit.

Description of the Related Art

As display devices which are used for a monitor of a computer, a television, or a cellular phone, there are an organic light emitting display (OLED) device which is a self-emitting device and a liquid crystal display (LCD) device which requires a separate light source, and the like.

An applicable range of the display device is diversified to personal digital assistants as well as monitors of computers and televisions and a display device with a large active area and a reduced volume and weight is being studied.

Further, recently, a flexible display device which is manufactured by forming a display element, a wiring line, and the like on a flexible substrate such as plastic which is a flexible material so as to be capable of displaying images even though the display device is bent or rolled, is getting attention as the next generation display device.

SUMMARY OF THE DISCLOSURE

An object to be achieved by the present disclosure is to provide a display device which minimizes the cover glass from being loosened from the display panel which can occur due to repeated sliding.

Another object to be achieved by the present disclosure is to provide a display device which minimizes a damage of a display panel which can occur due to a stress from an elastic member when the display panel is accommodated in the housing unit.

Still another object to be achieved by the present disclosure is to provide a display device which minimizes excessive tensile stress which can be generated from the elastic member when the display device slides.

Still another object to be achieved by the present disclosure is to provide a display device which improves a rigidity without reducing flexibility.

Still another object to be achieved by the present disclosure is to provide a display device which maintains the display panel which is disposed at the outside of the housing unit to be flat without lowering a display quality of the display device.

Objects of the present disclosure are not limited to the above-mentioned objects, and other objects, which are not mentioned above, can be clearly understood by those skilled in the art from the following descriptions.

In order to achieve the above-described object, according to an aspect of the present disclosure, a display device includes a display panel, a roller which guides the sliding of the display panel; a rotary shaft which passes through both ends of the roller; and an elastic member having one end connected to an inner circumferential surface of the roller and the other end connected to the rotary shaft, and the roller and the rotary shaft are rotatably connected to each other. Thus, according to the present disclosure, one end and the other end of the elastic member are configured to be rotatable to minimize the excessive increase of the tensile stress of the elastic member which is transmitted to the display panel and improve the reliability of the display panel.

In order to achieve the above-described object, according to another aspect of the present disclosure, a display device includes a display unit, a roller to which one end of the display unit is fastened, a rotary shaft which is rotatably connected to the roller and has a central axis which is the same as a central axis of the roller; an elastic member which is disposed in the roller, has one end connected to the roller and the other end connected to the rotary shaft; and a motor which rotates the rotary shaft, and the roller is rotated by the elastic member. Thus, according to the present disclosure, energy to be stored in the elastic member can be controlled so as not to apply excessive stress to the display unit while reducing a slip difference of the display unit and the roller. As such, according to the present disclosure, the roller is rotated by the elastic member so as to correspond to the rotation of the rotary shaft and the display unit, thereby compensating for the slip difference of the display unit and the roller.

Other detailed matters of the exemplary embodiments are included in the detailed description and the drawings.

According to the present disclosure, a tensile stress of an elastic member which is applied to a display unit when the display device is wound and unwound can be maintained to be constant.

According to the present disclosure, the slip of the roller and the display unit due to a rotational speed difference between the roller and the display unit when the display device is wound and unwound can be reduced.

According to the present disclosure, the separation of the cover window from the display panel due to the repeated bending of the display device can be minimized.

According to the present disclosure, possible damage to the flexible film and the printed circuit board when the display device is wound and unwound can be minimized.

According to the present disclosure, the display panel can be maintained to be flat while minimizing the recognition of the spots of the display panel disposed at the outside of the housing unit.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1A:
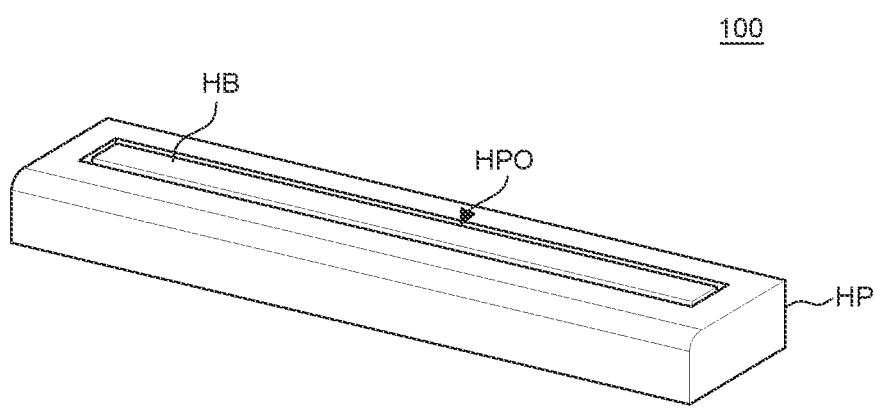
FIGS. 1A and 1B are side views of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings. All the components of each display device according to all embodiments of the present disclosure are operatively coupled and configured.

Figure 1B:
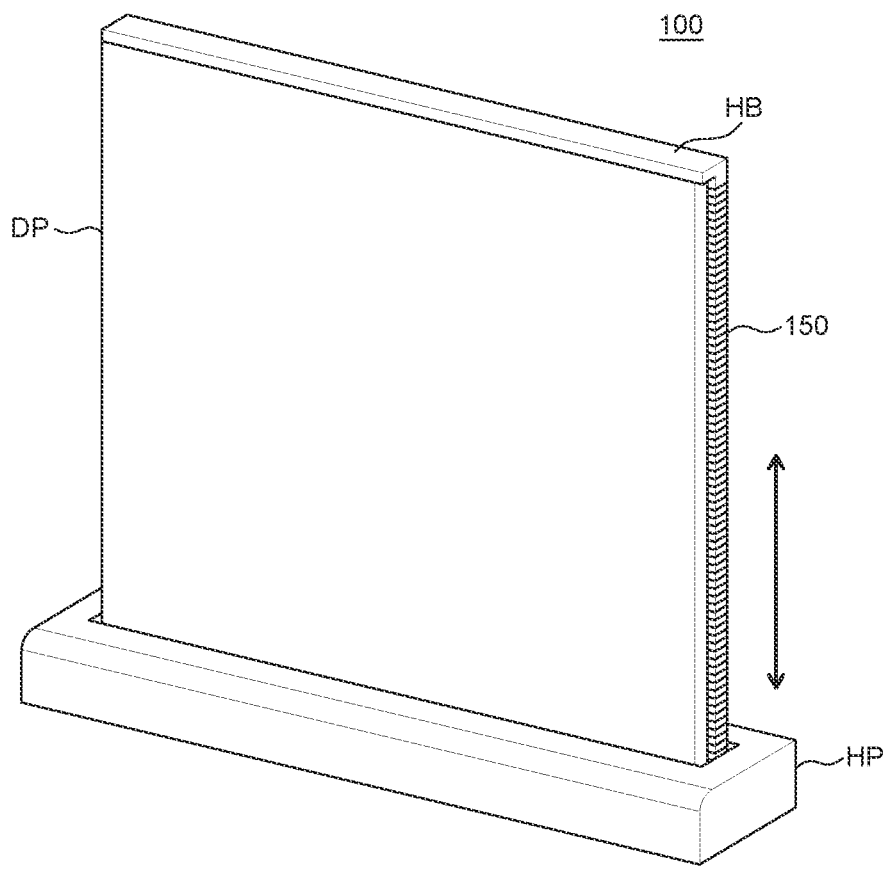

FIGS. 1A and 1B are side views of a display device according to an exemplary embodiment of the present disclosure.

Referring to FIGS. 1A and 1B, a display device 100 according to an exemplary embodiment of the present disclosure includes a display unit DP, a head bar HB, a chain 150, and a housing unit HP.

The display unit DP is a configuration for displaying images to a user and for example, in the display unit DP, a display element and a circuit, a wiring line, a component, and the like for driving the display element can be disposed. In this case, the display device 100 according to the exemplary embodiment of the present disclosure is a slidable display device so that the display unit DP can be configured to be slidable while being bent in accordance with a shape of a roller disposed in the housing unit HP. The display unit DP can be configured to be bent in accordance with a shape of the roller in the housing unit HP to be wound around or unwound from the roller. For example, the display unit DP can include a display panel having a flexibility to be wound or unwound.

The head bar HB fixes the display unit DP and the chain 150 at an uppermost end of the display unit DP. The head bar HB can cover only a part of a surface which is adjacent to an uppermost edge of the display unit DP so as not to block an image displayed on the front surface of the display unit DP. The display unit DP can move to the outside of the housing unit HP or the inside of the housing unit HP, by the head bar HB connected to the display unit DP and the chain 150, in accordance with the movement of the chain 150.

The chain 150 can be disposed on both sides (e.g., two opposite sides) or other side(s) of the display unit DP on a rear surface of the display unit DP. The chain 150 is connected to both sides of the display unit DP to move the display unit DP to the inside of the housing unit HP or the outside of the housing unit HP. The chain 150 can move to the inside of the housing unit HP or the outside of the housing unit HP by a sprocket to be described below and the display unit DP connected to the chain 150 can also move together with the chain 150.

The housing unit HP is a case in which the display unit DP, the head bar HB, and the chain 150 are accommodated. The display unit DP can be slidably wound to be accommodated in the housing unit HP and the display unit DP can be slidably unwound to be disposed at the outside of the housing unit HP.

The housing unit HP has an opening HPO through which the display unit DP moves to the inside and the outside of the housing unit HP. The display unit DP passes through the opening HPO of the housing unit HP to be exposed to the outside of the housing unit HP or be accommodated in the housing unit HP.

In the meantime, the display unit DP of the display device 100 can be switched from a fully unwound state to a fully wound state or from a fully wound state to a fully unwound state.

FIG. 1A illustrates a fully unwound state of the display unit DP of the display device 100 and the display unit DP of the display device 100 slides to be disposed at the outside of the housing unit HP. For example, in order for a user to watch images through the display device 100, when the display unit DP is unwound to be disposed at the outside of the housing unit HP as much as possible and cannot further slide, it can be defined as a fully unwound state.

FIG. 1B illustrates the display unit DP of the display device 100 which is fully wound. In the fully wound state, the display unit DP of the display device 100 slides to be accommodated in the housing unit HP and cannot further slide, for example, the display unit DP cannot be further wound. For example, when the user does not watch the images through the display device 100, it is advantageous from the viewpoint of an outer appearance that the display unit DP is not disposed at the outside of the housing unit HP. Therefore, when the display unit DP is wound to be accommodated in the housing unit HP, it is defined as a fully wound state. Further, when the display unit DP is in a fully wound state to be accommodated in the housing unit HP, a volume of the display device 100 is reduced so that the display device 100 can be easily carried.

Hereinafter, the display unit DP will be described below in more detail with reference to FIGS. 2 to 4.

Figure 2:
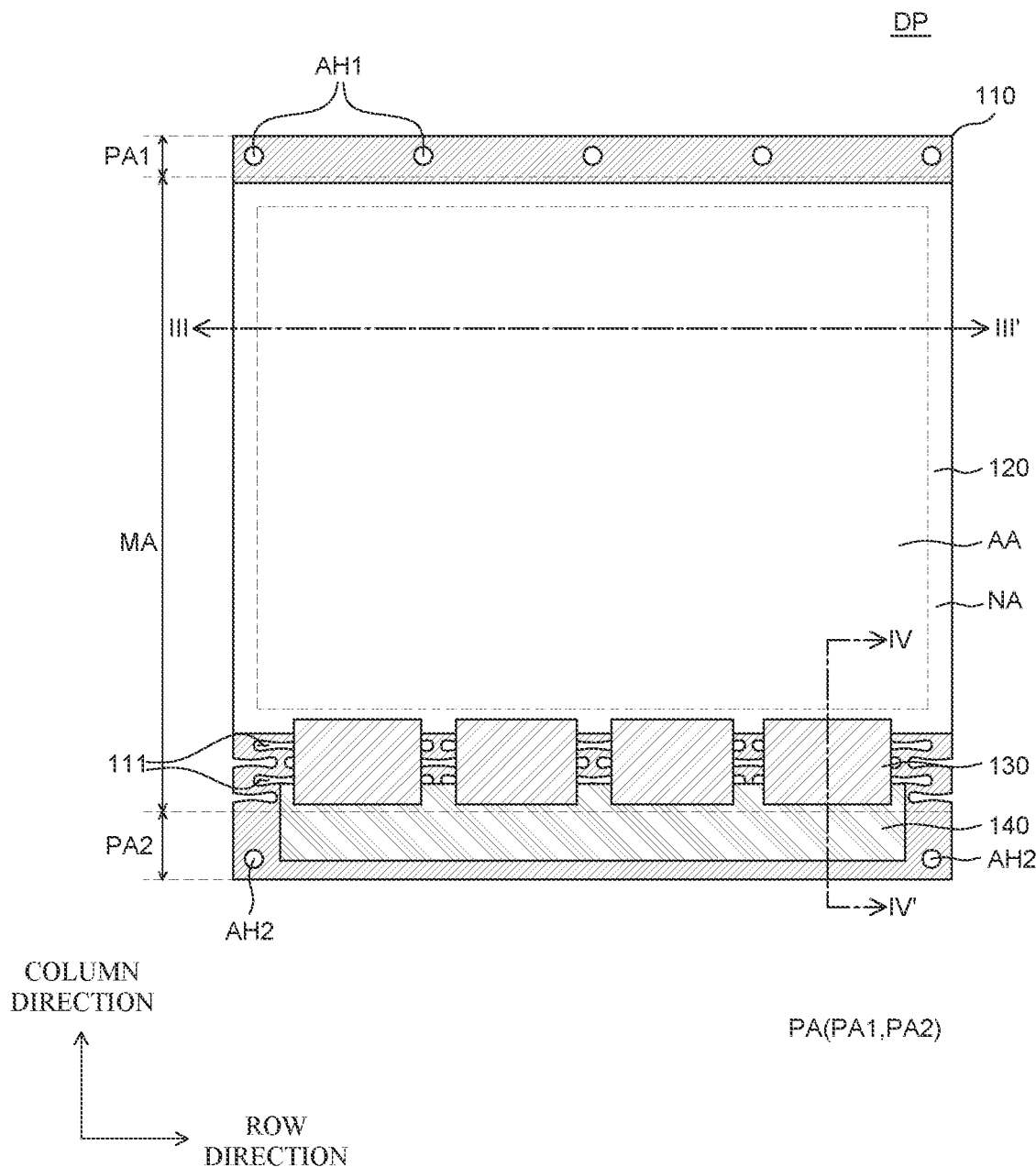
FIG. 2 is a plan view of a display unit of a display device according to an exemplary embodiment of the present disclosure.

FIG. 2 is a plan view of a display unit of a display device according to an exemplary embodiment of the present disclosure. FIG. 3 is a cross-sectional view taken along the line III-III' of FIG. 2. FIG. 4 is a cross-sectional view taken along the line IV-IV' of FIG. 2.

Figure 3:
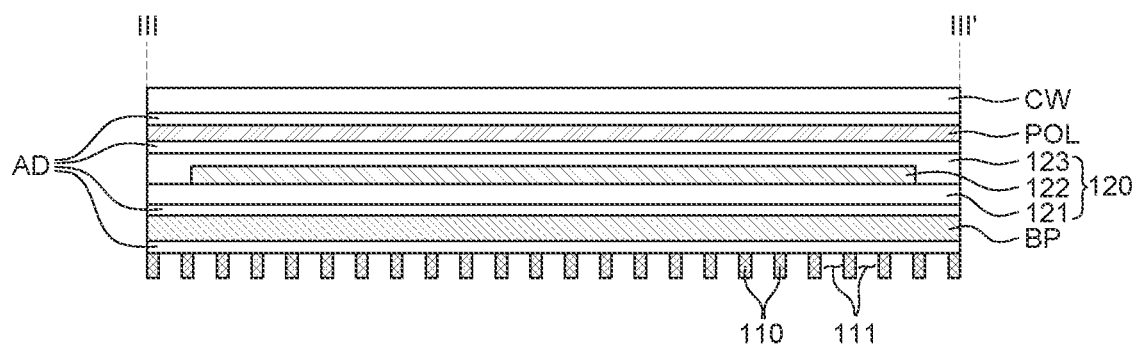
FIG. 3 is a cross-sectional view taken along the line of FIG. 2.
Figure 4:
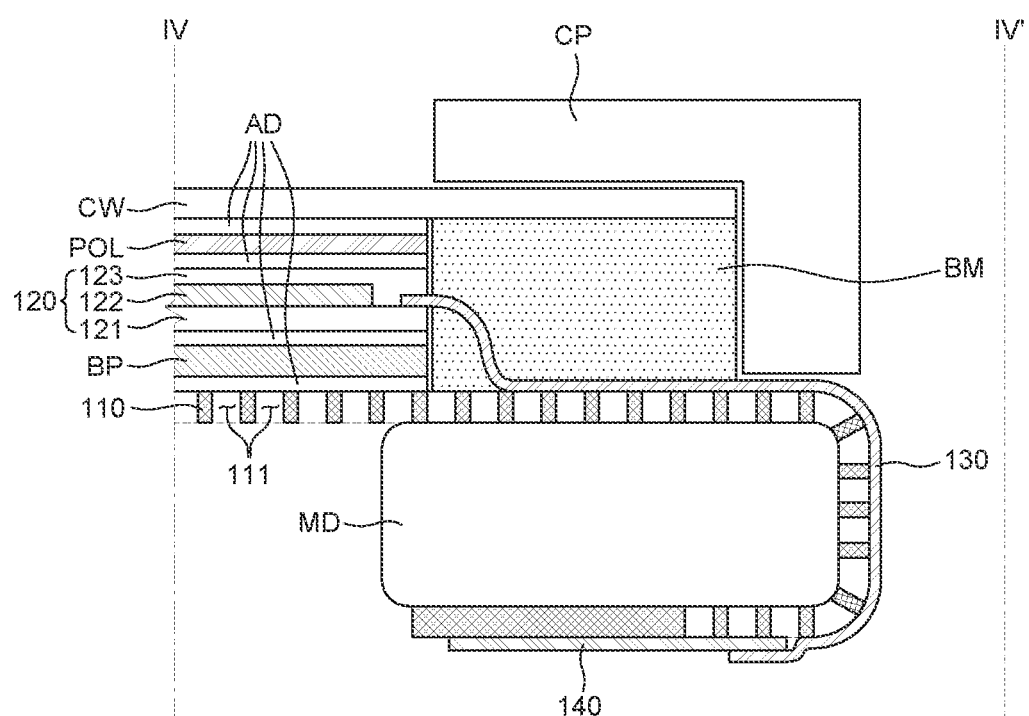
FIG. 4 is a cross-sectional view taken along the line IV-IV' of FIG. 2.

Referring to FIGS. 2 to 4, the display device 100 according to the exemplary embodiment of the present disclosure includes a display unit DP including a mid frame 110, a display panel 120, a back plate BP, a polarizing plate POL, a cover window CW, a plurality of flexible films 130, and a printed circuit board 140, a mandrel MD, and a cover unit CP. For the convenience of description, in FIG. 2, the mandrel MD and the cover unit CP are not illustrated.

Referring to FIGS. 2 and 3, the display panel 120 is a configuration which displays images to a user. The display panel 120 can include a display element which displays images, a driving element which drives the display element, wiring lines which transmit various signals to the display element and the driving element, and the like.

The display element can be defined in different manners depending on the type of the display panel 120. For example, when the display panel 120 is an organic light emitting display panel, the display element can be an organic light emitting diode which includes an anode, an organic light emitting layer, and a cathode. For example, when the display panel 120 is a liquid crystal display panel, the display element can be a liquid crystal display element. Hereinafter, even though the display panel 120 is assumed as an organic light emitting display panel, the display panel 120 is not limited to the organic light emitting display panel. Further, the display device 100 according to the exemplary embodiment of the present disclosure is a slidable display device which is configured to be slidable along a surface of the roller so that the display panel 120 can be implemented by a flexible display panel 120 which is bendable in accordance with a shape of the roller.

The display panel 120 includes an active area AA and a non-active area NA.

The active area AA is an area where images are displayed. In the active area AA, a plurality of sub pixels which configures the plurality of pixels and a driving circuit for driving the plurality of sub pixels can be disposed. The plurality of sub pixels is minimum units which configure the active area AA and a display element can be disposed in each of the plurality of sub pixels. For example, an organic light emitting diode which includes an anode, an organic light emitting layer, and a cathode can be disposed in each of the plurality of sub pixels, but it is not limited thereto. Further, a driving circuit for driving the plurality of sub pixels can include a driving element, a wiring line, and the like. For example, the driving circuit can be configured by a thin film transistor, a storage capacitor, a gate line, a data line, and the like but is not limited thereto.

The non-active area NA is an area where no image is displayed. In the non-active area NA, various wiring lines and circuits for driving the organic light emitting diode of the active area AA are disposed. For example, in the non-active area NA, a link line which transmits signals to the plurality of sub pixels and driving circuits of the active area AA, a driving IC such as a gate driver IC or a data driver IC, or the like can be disposed, but the non-active area is not limited thereto.

Referring to FIG. 3, the display panel 120 includes a substrate 121, a pixel unit 122, and an encapsulation unit 123.

The substrate 121 is a base member which supports various components of the display panel 120 and can be configured by an insulating material. The substrate 121 can be formed of a material having a flexibility to allow the display panel 120 to be wound or unwound. For example, the substrate 121 can be formed of a plastic material such as polyimide PI.

The pixel unit 122 is disposed on the substrate 121. The pixel unit 122 includes a plurality of organic light emitting diodes and a circuit for driving the plurality of organic light emitting diodes. The pixel unit 122 can be disposed so as to correspond to the active area AA.

In the meantime, the display panel 120 can be configured by a top emission type or a bottom emission type, depending on an emission direction of light which is emitted from the organic light emitting diode.

According to the top emission type, light emitted from the pixel unit 122 emits to an upper portion of the substrate 121 on which the pixel unit 122 is formed. In the case of the top emission type, a reflective layer can be formed below the anode to allow the light emitted from the organic light emitting diode of the pixel unit 122 to travel to the upper portion of the substrate 121, for example, toward the cathode.

According to the bottom emission type, light emitted from the pixel unit 122 emits to a lower portion of the substrate 121 on which the pixel unit 122 is formed. In the case of the bottom emission type, the anode can be formed only of a transparent conductive material and the cathode can be formed of the metal material having a high reflectance to allow the light emitted from the organic light emitting diode of the pixel unit 122 to travel to the lower portion of the substrate 121.

Hereinafter, for the convenience of description, the description will be made by assuming that the display device 100 according to an exemplary embodiment of the present disclosure is a top emission type display device, but it is not limited thereto.

The encapsulation unit 123 is disposed to cover the pixel unit 122. The encapsulation unit 123 seals the organic light emitting diode of the pixel unit 122. The encapsulation unit 123 can protect the organic light emitting diode of the pixel unit 122 from moisture, oxygen, impacts, and the like of the outside. The encapsulation unit 123 can be formed by alternately laminating a plurality of inorganic layers and a plurality of organic layers. For example, the inorganic layer can be formed of an inorganic material such as silicon nitride (SiNx), silicon oxide (SiOx), and aluminum oxide (AlOx) and the organic layer can be formed of epoxy or acrylic polymer, but they are not limited thereto.

The back plate BP is disposed below the display panel 120. The back plate BP can support the display panel 120 below the display panel 120 and protect the display panel 120 from the moisture, impacts, heat, and the like from the outside. When the substrate 121 of the display panel 120 is formed of a flexible material such as polyimide, the back plate BP which supports the substrate 121 of the display panel 120 can be disposed below the substrate 121.

The mid frame 110 is disposed below the back plate BP. The mid frame 110 is disposed on a rear surface of the display panel 120 to support the display panel 120 and protect other configurations of the display unit DP from the outside. A size of the mid frame 110 can be larger than a size of the display panel 120. At least some of a plurality of edges of the mid frame 110 can outwardly protrude from the display panel 120. For example, an upper edge and a lower edge of the mid frame 110 can protrude from an upper edge and a lower edge of the display panel 120. Further, a length of the mid frame 110 in a column direction can be longer than a sum of lengths of the display panel 120, the plurality of flexible films 130, and the printed circuit board 140 in the column direction. For example, all the display panel 120, the plurality of flexible films 130, and the printed circuit board 140 can overlap the mid frame 110. As illustrated in FIG. 2, a left edge and a right edge of the mid frame 110 can match a left edge and a right edge of the display panel 120, but is not limited thereto so that the left edge and the right edge of the mid frame 110 can also outwardly protrude from the display panel 120.

Even though the mid frame 110 is formed of a material having a rigidity, the mid frame 110 can have a flexibility to be wound or unwound together with the display panel 120. For example, the mid frame 110 can be formed of a metal material such as steel use stainless (SUS) or invar or plastic. Further, the mid frame 110 can be deformed as a plurality of openings 111 to be described below contracts or expands. However, if the material of the mid frame 110 satisfies physical conditions such as a thermal strain amount, a radius of curvature, and a rigidity, the material can be diversely changed depending on the design, and is not limited thereto.

Referring to FIG. 2, the mid frame 110 includes a malleable area MA and a plurality of support areas PA. For example, a first support area PA1, the malleable area MA, and a second support area PA2 are sequentially disposed from the uppermost end of the mid frame 110. A first support area PA1, the malleable area MA, and a second support area PA2 can be sequentially disposed along the column direction.

The first support area PA1 and the second support area PA2 are areas in which the plurality of openings 111 is not disposed, but only the plurality of fastening hole AH1 and AH2 is disposed. A first fastening hole AH1 can be formed in the first support area PA1 and a second fastening hole AH2 can be formed in the second support area PA2.

The first support area PA1 is disposed at an uppermost area of the mid frame 110 and is fastened with the head bar HB. The first support area PA1 protrudes above the display panel 120 to be fastened with the head bar HB. The first support area PA1 includes one or more first fastening holes AH1 to be fastened with the head bar HB. For example, screws which pass through the head bar HB and the first fastening holes AH1 are disposed so that the head bar HB can be fastened with the first support area PA1.

The malleable area MA is an area extending from the first support area PA1 to a lower side of the mid frame 110. The malleable area MA is an area in which a plurality of openings 111 is disposed and the display panel 120 is attached. The malleable area MA is an area which is wound around or unwound from the roller together with the display panel 120. The malleable area MA can overlap at least the display panel 120 among other configurations of the display unit DP.

The second support area PA2 is an area extending from the malleable area MA to a lower side of the mid frame 110. The second support area PA2 is an area to be fastened with the mandrel MD to be described below. The second support area PA2 can include one or more second fastening holes AH2 to be fastened with the mandrel MD. For example, screws which pass through the second fastening holes AH2 and the mandrel MD are disposed so that the second support area PA2 and the mandrel MD can be fastened.

In the meantime, the plurality of openings 111 disposed in the malleable area MA of the mid frame 110 can be deformed by a stress which is applied to the display unit DP. For example, when the display unit DP slides to the inside or outside of the housing unit HP, the mid frame 110 can be deformed as the plurality of openings 111 contracts or expands. Further, as the plurality of openings 111 contracts or expands, a slip phenomenon of the display panel 120 disposed on the mid frame 110 is minimized so that the stress which is applied to the display panel 120 can be minimized.

When the display panel 120 and the mid frame 110 are wound, a difference between a length of the display panel 120 which is wound around the roller and a length of the mid frame 110 which is wound around the roller can be caused due to the difference of radii of curvature of the display panel 120 and the mid frame 110. When the mid frame 110 and the display panel 120 are wound around the roller, lengths required for the mid frame 110 and the display panel 120 to be wound around the roller can be different. For example, when the display panel 120 is disposed at the outside from the mid frame 110 with respect to the roller, a length of the display panel 120 to be wound around a predetermined part of the roller can be longer than a length of the mid frame 110 to be wound around the predetermined part of the roller once. As described above, the winding lengths of the mid frame 110 and the display panel 120 are different from each other due to the difference of radii of curvature at the time of winding the display unit DP and the display panel 120 attached to the mid frame 110 can slide to be shifted from its original position.

If the mid frame 110 and the display panel 120 excessively move, the display panel 120 can be detached from the mid frame 110 or defects such as cracks can be generated. Accordingly, a plurality of openings 111 which is contractible or expandable is formed in the mid frame 110 to compensate for a length difference of the mid frame 110 and the display panel 120 due to a difference in a radius of curvature during the winding of the mid frame 110 and the display panel 120. Further, a stress which is applied to the display panel 120 from the mid frame 110 due to the deformation of the plurality of openings 111 during the process of winding the mid frame 110 and the display panel 120 can also be relieved.

The polarizing plate POL is disposed on the display panel 120. The polarizing plate POL selectively transmits light to reduce the reflection of external light which is incident onto the display panel 120. Specifically, the display panel 120 includes various metal materials applied to the semiconductor element, the wiring line, the organic light emitting diode, and the like. Therefore, the external light incident onto the display panel 120 can be reflected from the metal material so that the visibility of the display device 100 can be reduced due to the reflection of the external light. However, when the polarizing plate POL is disposed, the polarizing plate POL suppresses the reflection of the external light so that the outdoor visibility of the display device 100 can be increased. However, the polarizing plate POL can be omitted depending on an implementation example of the display device 100.

The cover window CW is disposed on the polarizing plate POL. The cover window CW can protect the display panel 120 below the cover window CW from the impact, the moisture, heat, and the like from the outside. The cover window CW can be formed of a material having an impact resistance and optical transmittance. For example, the cover window CW can be a substrate formed of glass or a thin film formed of a plastic material such as polymethylmethacrylate (PMMA), polyimide, or polyethylene terephthalate (PET).

Referring to FIG. 4 together, one end of the cover window CW can be disposed to protrude from one end of the display panel 120. One end of the cover window CW protrudes outwardly from the display panel 120 to be disposed in the cover unit CP. One end of the cover window CW is disposed in the cover unit CP to minimize the loosening of the cover window CW from the display panel 120 when the display unit DP is wound or unwound.

Adhesive layers AD are disposed between the cover window CW, the polarizing plate POL, the display panel 120, the back plate BP, and the mid frame 110. The adhesive layers AD bond the cover window CW, the polarizing plate POL, the display panel 120, the back plate BP, and the mid frame 110 to each other. The adhesive layer AD is formed of a material having adhesiveness and can be a thermosetting or natural curable type adhesive. For example, the adhesive layer AD can be formed of an optical clear adhesive (OCA), a pressure sensitive adhesive (PSA), or the like, but is not limited thereto.

Referring to FIGS. 2 to 4, one or more flexible films 130 is disposed at one end of the display panel 120. For example, one or a plurality of flexible films 130 can be disposed depending on the design. Hereinafter, for the convenience of description, even though it is described that a plurality of flexible films 130 is disposed, the number of flexible films 130 can vary depending on the design and is not limited thereto.

The plurality of flexible films 130 can be electrically connected to one end of the display panel 120. The plurality of flexible films 130 is films in which various components are disposed on a base film having a malleability to supply a signal to the plurality of sub pixels and the driving circuit which configure the plurality of pixels of the active area AA. The plurality of flexible films 130 can supply a power voltage, a data voltage, and the like to the plurality of sub pixels and the driving circuit of the display panel 120. For example, the plurality of flexible films 130 is electrically connected to the pad unit formed on the substrate 121 of the display panel 120 to supply various signals to the display panel 120.

In the meantime, a driving IC such as a gate driver IC or a data driver IC can be disposed on the plurality of flexible films 130. The driving IC is a component which processes data for displaying images and a driving signal for processing the data. The driving IC can be disposed by a chip on glass (COG), a chip on film (COF), a tape carrier package (TCP) technique, or the like depending on a mounting method. However, for the convenience of description, it is described that the driving IC is mounted on the plurality of flexible films 130 by a chip on film technique, but is not limited thereto.

The printed circuit board 140 is connected to the plurality of flexible films 130. The printed circuit board 140 is a component which supplies signals to the driving IC. Various components can be disposed in the printed circuit board 140 to supply various signals such as a driving signal or a data signal to the driving IC. In the meantime, even though one printed circuit board 140 is illustrated in the drawings, the number of printed circuit boards 140 can vary depending on the design and is not limited thereto.

An additional printed circuit board 140 which is coupled to the printed circuit board 140 can be further disposed. For example, the printed circuit board 140 can be referred to as a source printed circuit board S-PCB on which the data driver is mounted. Further, an additional printed circuit board connected to the printed circuit board 140 can be referred to as a control printed circuit board C-PCB on which a timing controller and the like is mounted. The additional printed circuit board can be disposed in the roller, can be disposed in the housing unit HP at the outside of the roller, or can be disposed to be in direct contact with the printed circuit board 140.

The mandrel MD is connected to the display unit DP. The mandrel MD can be disposed to overlap the plurality of flexible films 130 and the printed circuit board 140. Further, the mandrel MD can overlap a part of the mid frame 110. The mandrel MD can guide a position of the plurality of flexible films 130 and the printed circuit board 140 and also serve as a connection member to be described below which connects the roller and the display unit DP.

Specifically, the mandrel MD can be disposed on the rear surface of the mid frame 110. A part of the mid frame 110 can be disposed to enclose the mandrel MD. A part of the malleable area MA of the mid frame 110 can be in contact with one surface of the mandrel MD, a side surface of the mandrel MD, and an opposite surface of one surface of the mandrel MD and the second support area PA2 can be in contact with the opposite surface of the one surface of the mandrel MD.

A part of the cover window CW can be disposed on one surface of the mandrel MD. One end of the cover window CW protrudes from the display panel 120 to overlap the mandrel MD.

The plurality of flexible films 130 connected to one end of the display panel 120 can be disposed to enclose the mandrel MD. The plurality of flexible films 130 can extend to one surface of the mandrel MD, the side surface of the mandrel MD, and the opposite surface of one surface of the mandrel MD. The plurality of flexible films 130 can pass between one surface of the mandrel MD and the cover window CW to extend toward the opposite surface of one surface of the mandrel MD. In this case, a cross-sectional shape of the plurality of flexible films 130 can be a "U" shape.

In the meantime, a plurality of grooves can be formed in the mandrel MD so that driving ICs of the plurality of flexible films 130 are seated therein. The driving IC disposed in the plurality of flexible films 130 which encloses the mandrel MD can be seated in the groove formed in the mandrel MD and the interference of the driving IC with the outside can be minimized. In this case, a separate hole which exposes the groove of the mandrel MD can be formed in the mid frame 110. However, a plurality of grooves of the mandrel MD can be omitted depending on the placement of the driving IC and it is not limited thereto.

The printed circuit board 140 connected to the plurality of flexible films 130 can be disposed on an opposite surface of one surface of the mandrel MD. The printed circuit board 140 can be disposed to be spaced apart from the display panel 120 with the mandrel MD therebetween. The printed circuit board 140 is disposed on the opposite surface of one surface of the mandrel MD to be fixed to the mandrel MD. For example, screws which pass through the printed circuit board 140, the second fastening hole AH2 of the mid frame 110, and the mandrel MD are disposed in an area between the plurality of flexible films 130 which is spaced apart from each other. By doing this, the printed circuit board 140, the mid frame 110, and the mandrel MD are fixed to each other, but the fixing method of the printed circuit board 140 is not limited thereto.

The cover unit CP is disposed to cover one end of the cover window CW. The cover unit CP can be disposed to cover the cover window CW protruding from one end of the display panel 120. The cover unit CP which covers the cover window CW can be fixed to the mandrel MD. For example, the screws which pass through the cover unit CP, the mid frame 110, the mandrel MD, and the printed circuit board 140 are disposed in an area between the plurality of flexible films 130 which is spaced apart from each other. By doing this, the cover unit CP, the mid frame 110, the mandrel MD, and the printed circuit board 140 are fixed to each other, but the fixing method of the cover unit CP is not limited thereto.

A light shielding member BM is disposed between the cover unit CP and the mandrel MD. The light shielding member BM is disposed to be filled between the cover unit CP and the mandrel MD to minimize the plurality of flexible films 130 disposed between the cover unit CP and the mandrel MD from being recognized by the user.

In the meantime, even though in the drawing, it is illustrated that the mid frame 110 encloses one surface, the side surface, and the opposite surface of one surface of the mandrel MD, the mid frame 110 can be disposed on one surface of the mandrel MD or from one surface to the side surface. However, the placement of the mid frame 110 is not limited thereto. Further, even though it is illustrated that a part of the malleable area MA of the mid frame 110 and the second support area PA2 enclose the mandrel MD, only the second support area PA2 of the mid frame 110 can enclose the mandrel MD. Therefore, the lengths and the placement of the malleable area MA and the second support area PA are not limited thereto.

Further, even though in the drawings, it is illustrated that the printed circuit board 140 overlaps a part of the second support area PA2 and the malleable area MA of the mid frame 110, the entire printed circuit board 140 can overlap any one of the second support area PA2 or the malleable area MA, but is not limited thereto.

Hereinafter, an elevating unit EP and a roller unit RP which are disposed in the housing unit HP to wind and unwind the display unit DP will be described in more detail with reference to FIGS. 5A to 10.

Figure 5A:
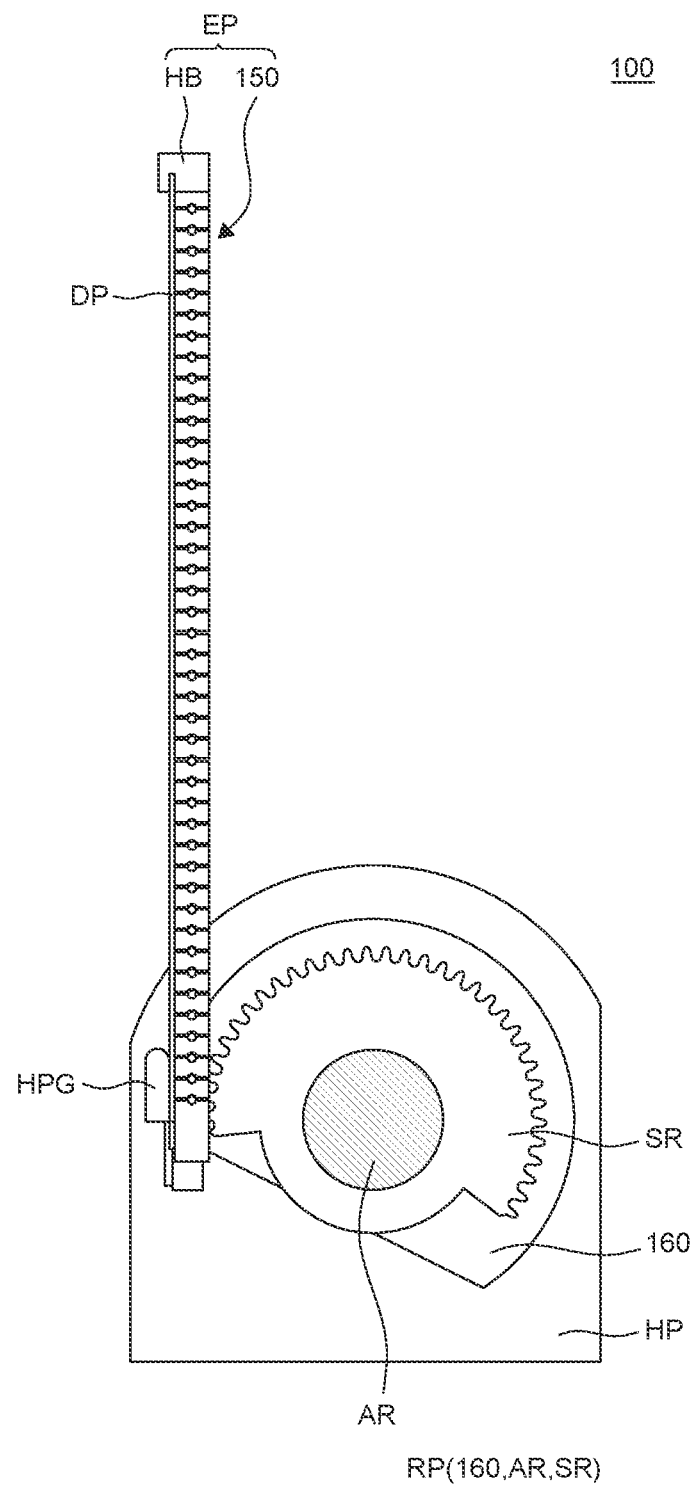
FIGS. 5A and 5B are side views of a display device according to an exemplary embodiment of the present disclosure.
Figure 5B:
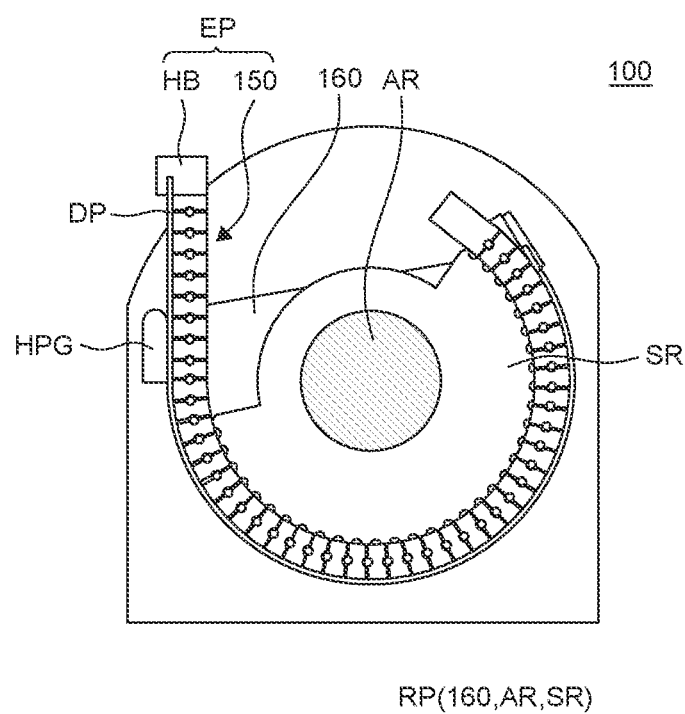
Figure 6:
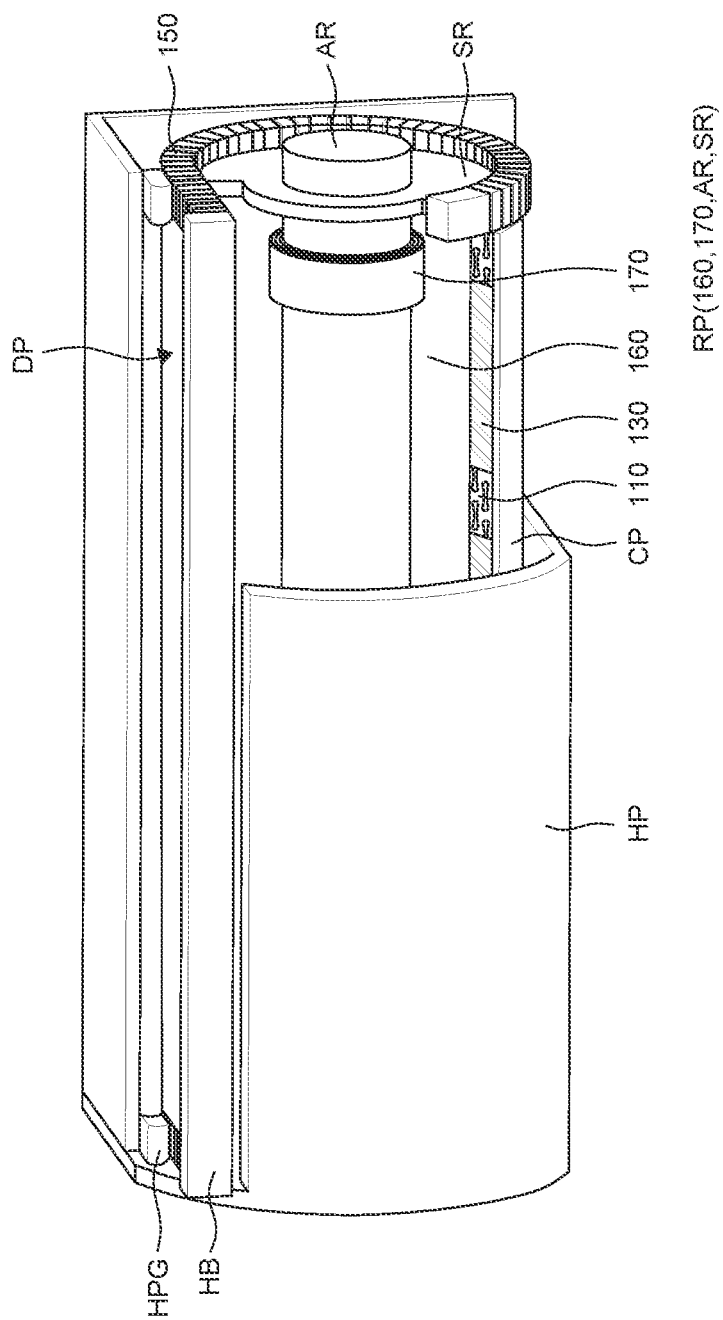
FIG. 6 is a perspective view of a display device according to an exemplary embodiment of the present disclosure.
Figure 7:
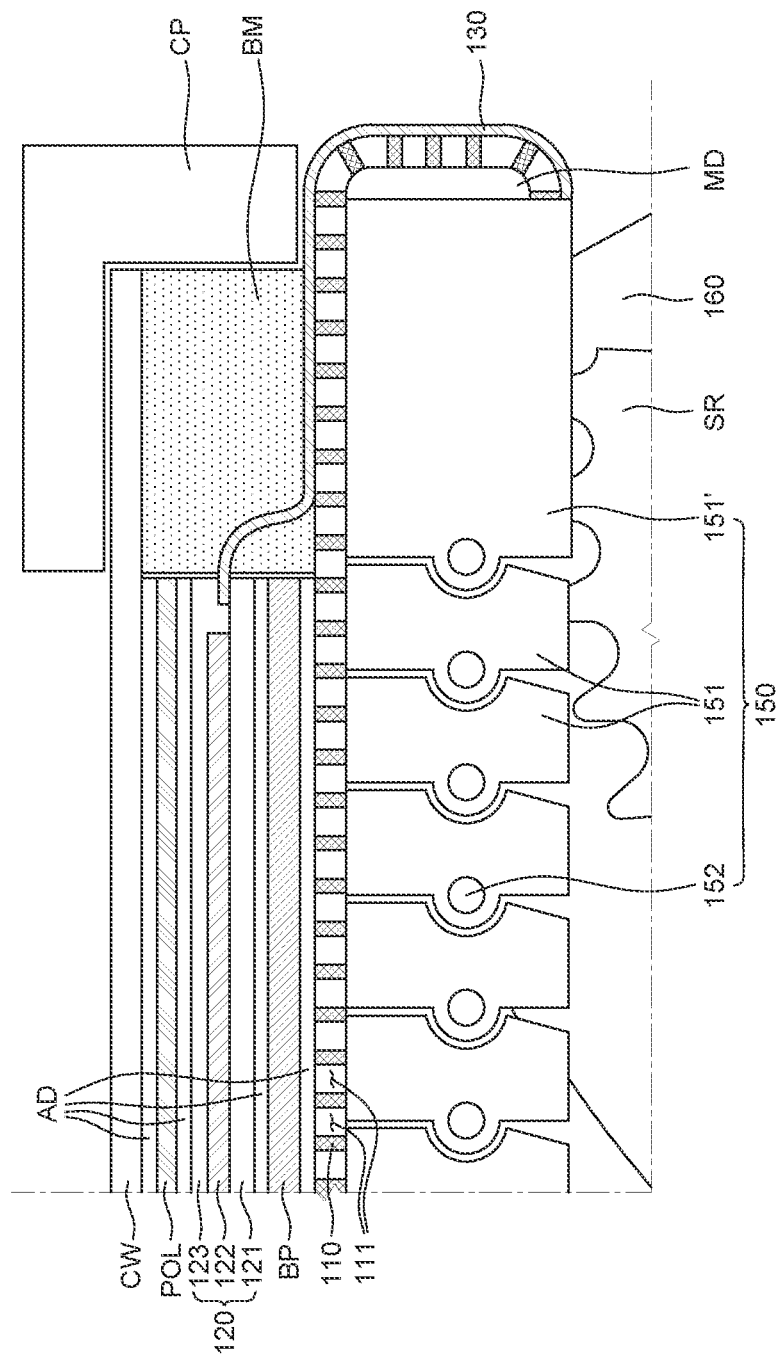
FIG. 7 is a cross-sectional view of a display device according to an exemplary embodiment of the present disclosure.
Figure 8A:
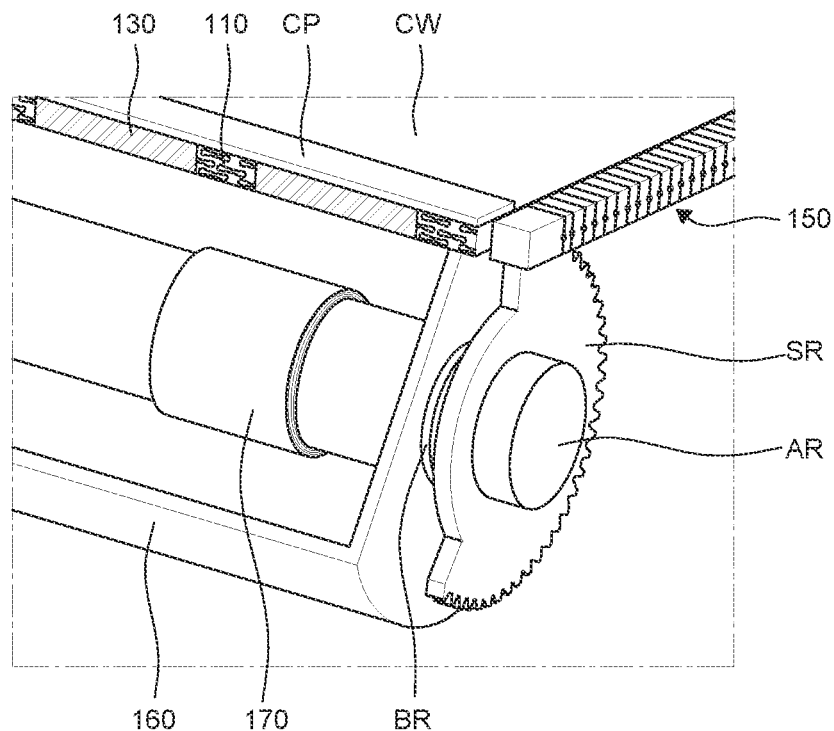
FIG. 8A is a perspective view of a display device according to an exemplary embodiment of the present disclosure.
Figure 8B:
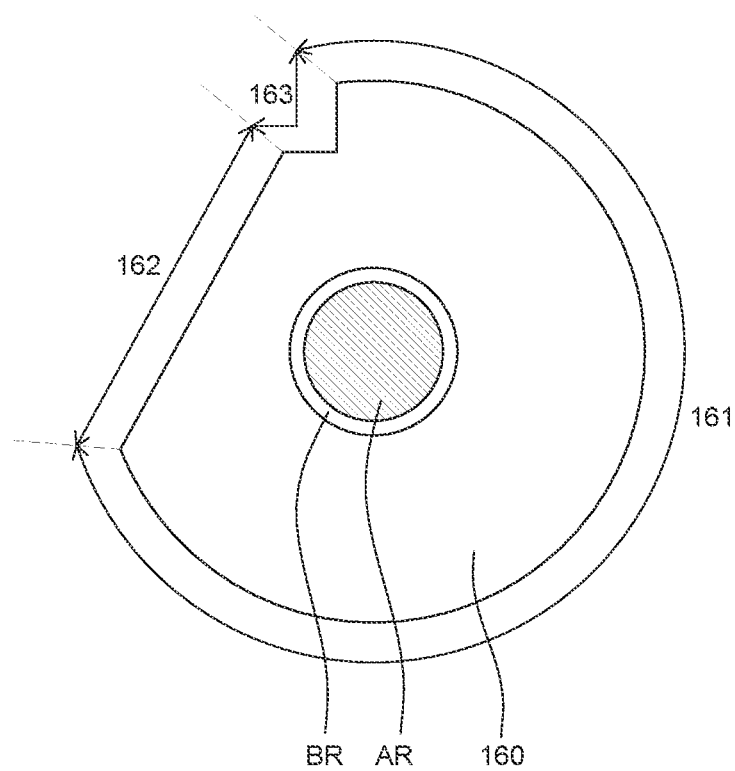
FIG. 8B is a cross-sectional view of a roller, a rotary shaft, and a bearing of a display device according to an exemplary embodiment of the present disclosure.
Figure 9:
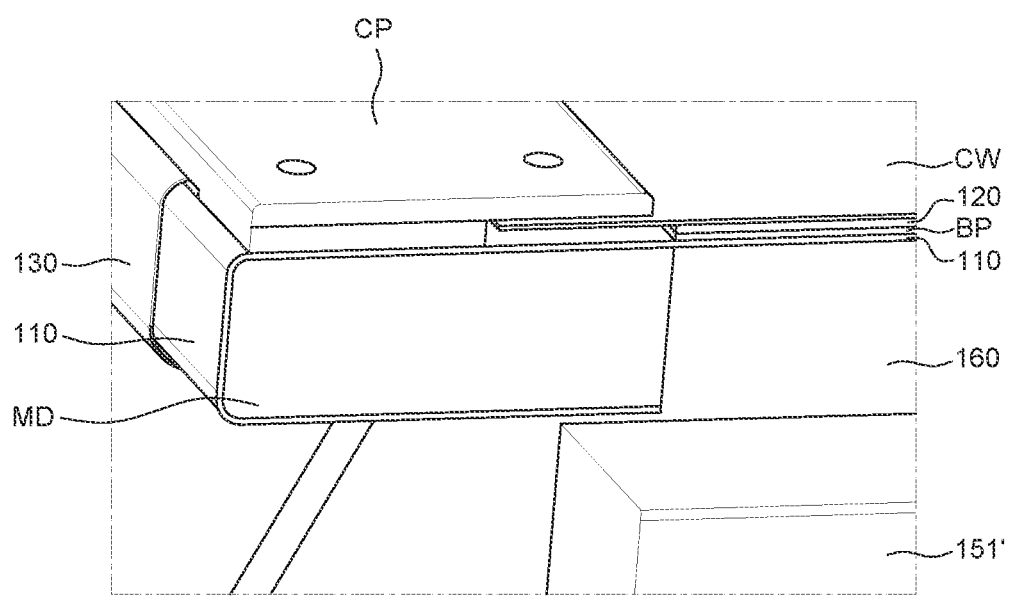
FIG. 9 is a perspective view of a display device according to an exemplary embodiment of the present disclosure.
Figure 10:
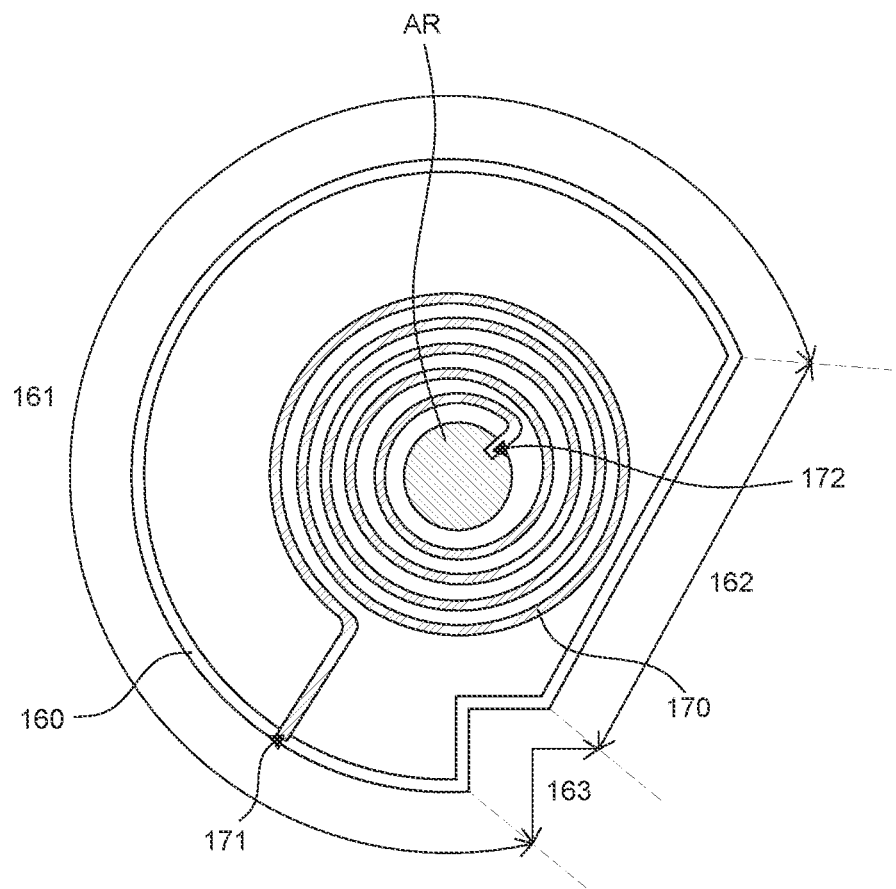
FIG. 10 is a schematic cross-sectional view of a roller, a rotary shaft, and an elastic member of a display device according to an exemplary embodiment of the present disclosure.

FIGS. 5A and 5B are side views of a display device according to an exemplary embodiment of the present disclosure. FIG. 6 is a perspective view of a display device according to an exemplary embodiment of the present disclosure. FIG. 7 is a cross-sectional view of a display device according to an exemplary embodiment of the present disclosure. FIG. 8A is a perspective view of a display device according to an exemplary embodiment of the present disclosure. FIG. 8B is a cross-sectional view of a roller, a rotary shaft, and a bearing of a display device according to an exemplary embodiment of the present disclosure. FIG. 9 is a perspective view of a display device according to an exemplary embodiment of the present disclosure. FIG. 10 is a schematic cross-sectional view of a roller, a rotary shaft, and an elastic member of a display device according to an exemplary embodiment of the present disclosure.

In FIGS. 5A and 5B, for the convenience of description, side views of the display device 100 taken along a side surface of the housing unit HP have been illustrated. In FIG. 6, for the convenience of description, it is illustrated that a part of the flat portion 162 of the roller 160 and a part of the housing unit HP are cut at the right side of the display device 100. In FIG. 8A, for the convenience of description, it is illustrated that the flat portion 162 of the roller 160 is cut. In FIG. 9, for the convenience of description, the opening 111 of the mid frame 110 is not illustrated.

Referring to FIGS. 5A to 6, a guide unit HPG which guides the movement of the display unit DP is disposed in the housing unit HP. The guide unit HPG is disposed to be adjacent to the opening HPO of the housing unit HP to guide the surface of the display unit DP which moves to the outside of the housing unit HP to be evenly stretched. In the guide unit HPG, a portion which is in contact with the display unit DP can be formed to be flat to evenly support the surface of the display unit DP which passes through the opening HPO of the housing unit HP. However, the guide unit HPG can be omitted depending on the design, so that it is not limited thereto.

The elevating unit EP moves the display unit DP to the outside of the housing unit HP or the inside of the housing unit HP in accordance with the driving of the roller unit RP. The elevating unit EP includes a head bar HB and a chain 150.

Referring to FIGS. 6 and 7, the chain 150 can be disposed on both sides of the display unit DP, on the rear surface of the display unit DP. The chain 150 can be connected to both sides of the mid frame 110, on the rear surface of the mid frame 110.

The chain 150 includes a plurality of chain segments 151 which are hingedly connected with each other. The plurality of chain segments 151 are hingedly connected with each other by a hinge shaft 152 to be bent or stretched. At this time, a chain segment 151' at the outermost edge among the plurality of chain segments 151 can be fixed to the sprocket SR and the chain 150 can move in accordance with the rotation of the sprocket SR.

At this time, in order to rotate the plurality of chain segments 151, one surface and an opposite surface of one surface of the plurality of chain segments 151 can have different widths. Specifically, except for a portion protruding to be connected to the hinge shaft 152, the farther from the display unit DP, the narrower the widths of the plurality of chain segments 151. One surface of each of the plurality of chain segments 151 can support a rear surface of the display unit DP, for example, the rear surface of the mid frame 110. When the display unit DP is in a flat state, one surface of each of the plurality of chain segments 151 is disposed on the same plane to support the display unit DP to be maintained in the flat state.

The opposite surface of one surface of each of the plurality of chain segments 151 can be engaged with the sprocket SR to be described below. The plurality of chain segments 151 can be disposed to be spaced apart from each other on the opposite surface of one surface and rotate in a spaced space. When the entire side surface of the plurality of chain segments 151 is in contact with a side surface of an adjacent chain segment 151, each of the plurality of chain segments 151 may not be bent. In contrast, when only parts of side surfaces of the plurality of chain segments 151 are in contact with each other and the remaining parts of the side surfaces are spaced apart from each other, the chain segments 151 rotate as much as the spaced space so that the chain 150 can be bent. Accordingly, the chain 150 which is formed of the plurality of chain segments 151 in which the width is increased as it is closer to the display unit DP can evenly support the display unit DP or can be bent only toward the rear surface of the display unit DP.

In the meantime, a force is applied to the display unit DP to be bent toward a front surface of the display unit DP and a force is applied to the chain 150 to be bent toward the rear surface of the display unit DP so that the display unit DP disposed at the outside of the housing unit HP can maintain a flat state. First, as illustrated in FIGS. 5A and 5B, the display unit DP can be bent such that the rear surface of the display unit DP is in contact with the roller 160. In this case, when the display unit DP moves to the inside of the housing unit HP, the display unit DP can be bent toward the rear surface of the display unit DP. Further, the remaining part of the display unit DP disposed at the outside of the housing unit HP can be bent toward the front surface of the display unit DP by a force which pulls the display unit DP in the direction of the rear surface of the display unit DP in the housing unit HP. In contrast, the chain 150 can be bent only in the direction of the rear surface of the display unit DP. For example, the chain 150 can be bent only along the surface of the roller 160. In summary, when the display unit DP is wound, a force is applied to the remaining part of the display unit DP disposed at the outside of the housing unit HP to be bent toward the front surface of the display unit DP and the chain 150 can be bent only toward the rear surface of the display unit DP. Accordingly, a force of the display unit DP which is directed to the front surface of the display unit DP and a force of the chain 150 which is directed to the rear surface of the display unit DP are offset so that a part of the display unit DP disposed at the outside of the housing unit HP forms a straight line.

Referring to FIGS. 6, 8A, and 8B together, the roller unit RP rotates the rotary shaft AR in a clockwise direction or a counterclockwise direction to move the display unit DP to the inside or the outside of the housing unit HP. The roller unit RP includes a roller 160, a rotary shaft AR, a sprocket SR, an elastic member 170, and a bearing BR.

The roller 160 is a member around which the display unit DP is wound. The roller 160 is a member in which the display unit DP is seated when the display unit DP is accommodated in the housing unit HP. Even though the roller 160 can have entirely a cylindrical shape, but a part thereof can be formed of a flat surface. The roller 160 includes a curved portion 161, a flat portion 162, and a seating portion 163. For example, the roller 160 includes the flat portion 162 which is a planar portion formed along a length direction of the roller 160, the curved portion 161 extending from the flat portion 162, and the seating portion 163 which is disposed between the curved portion 161 and the flat portion 162. The mandrel MD is seated in the seating portion 163.

Referring to FIG. 9 together, the roller 160 can be connected to the mandrel MD and the display unit DP by means of the seating portion 163. The mandrel MD is seated in the seating portion 163 of the roller 160 to be fixed to the roller 160. Specifically, the mandrel MD can be seated such that the printed circuit board 140 and the opposite surface of one surface of the mandrel MD correspond to the seating portion 163. At this time, the mandrel MD can be seated such that the plurality of flexible films 130 which encloses the mandrel MD is directed to the flat portion 162 and the display panel 120 is directed to the curved portion 161. For example, the mandrel MD can be seated in the seating portion 163 such that one end of the display panel 120 is directed to the flat portion 162. Accordingly, an end of the display unit DP can be connected to the roller 160 by means of the mandrel MD and the display unit DP slides along the roller 160 to be wound around or unwound from the roller 160.

The rotary shaft AR is disposed in the roller 160. Both ends of the rotary shaft AR are disposed to pass through both ends of the roller 160. A central axis of the rotary shaft AR can be disposed on the same line as a central axis of the roller 160. The rotary shaft AR can rotate in the clockwise direction or the counterclockwise direction by the motor. When the rotary shaft AR rotates by the motor, the sprocket SR fixed to the rotary shaft AR and the chain 150 fixed to the sprocket SR can rotate together, and the chain 150 and the display unit DP connected to the chain 150 can move to the inside of the housing unit HP or the outside of the housing unit HP.

In the meantime, a motor can be connected to at least one of both ends of the rotary shaft AR protruding from the roller 160. The motor rotates the rotary shaft AR in the clockwise direction or the counterclockwise direction. The motor is connected to a power source unit, such as a separate external power source or a built-in battery, to be supplied with the power.

The sprocket SR is connected to a part of the rotary shaft AR protruding from the roller 160. The sprocket SR is a wheel having teeth that moves in engagement with the chain 150 and rotates together with the rotary shaft AR. A center portion of the sprocket SR is fixed to the rotary shaft AR so that the sprocket SR rotates together with the rotation of the rotary shaft AR. An end of the chain 150 is fixed to any one of teeth of the sprocket SR. For example, the chain segment 151' disposed at the end of the chain 150 can be fixed to the tooth of the sprocket SR. Accordingly, when the rotary shaft AR and the sprocket SR rotate, the plurality of chain segments 151 of the chain 150 having an end fixed to the sprocket SR is wound around the sprocket SR while being engaged with the teeth of the sprocket SR.

In the meantime, the display device 100 according to the exemplary embodiment of the present disclosure is a slidable display device in which the display unit DP slides along the surface of the roller 160 to move to the inside of the housing unit HP or the outside of the housing unit HP. At this time, the display unit DP may not be wound around the roller 160 more than one turn such that the display unit DP slides along the roller 160. For example, the display panel 120 of the display unit DP can be wound around the roller 160 so as to correspond to the curved portion 161 of the roller 160, but may not be wound around the flat portion 162 of the roller 160. When the display unit DP is wound around the roller 160 more than one turn, a part of the display unit DP can cover the display unit DP and the display unit DP may not slide along the roller 160 due to the part of the display unit DP which covers the display unit DP. In contrast, when the display unit DP is wound only around the curved portion 161 of the roller 160, the display unit DP can move to the outside of the housing unit HP while sliding along the roller 160. Accordingly, in the display device 100 according to the exemplary embodiment of the present disclosure, when the display unit DP is fully accommodated in the housing unit HP, the display unit DP can be disposed to enclose only a part of the roller 160.

In this case, the teeth of the sprocket SR can be formed to correspond only to the curved portion 161 of the roller 160. As described above, the display unit DP is not wound around the entire roller 160, but can be wound so as to correspond to a part of the roller 160, for example, the curved portion 161 of the roller 160. When the display unit DP is accommodated in the housing unit HP, the chain 150 connected to the side surface of the display unit DP can also be disposed to correspond to the curved portion 161 of the roller 160. Accordingly, even though the teeth of the sprocket SR to be engaged with the plurality of chain segments 151 of the chain 150 are formed to correspond to the flat portion 162 of the roller 160, the chain segments 151 are not engaged with the teeth. Therefore, the teeth of the sprocket SR can be formed to correspond only to the curved portion 161 of the roller 160.

The bearing BR is disposed between the roller 160 and the rotary shaft AR. The bearing BR is disposed between the roller 160 and the rotary shaft AR to reduce the fractional force when the rotary shaft AR and the roller 160 rotate to smoothly rotate the rotary shaft AR and the roller 160. Accordingly, the roller 160 and the rotary shaft AR can individually rotate by the bearing BR.

Referring to FIG. 10 together, the elastic member 170 is disposed in the roller 160. The elastic member 170 is disposed in the roller 160 to be connected to the roller 160 and the rotary shaft AR. Specifically, one end 171 of the elastic member 170 can be connected to an inner circumferential surface of the roller 160 and the other end 172 of the elastic member 170 can be connected to the rotary shaft AR. When the rotary shaft AR rotates by the motor, the other end 172 of the elastic member 170 can rotate together with the rotary shaft AR and one end 171 of the elastic member 170 rotates together with the roller 160. The elastic member 170 can have an elastic force, for example, can be a spiral spring, but is not limited thereto.

For example, referring to FIG. 10 and FIGS. 5A and 5B, when the display unit DP is withdrawn from the housing unit HP, the display unit DP and the mandrel MD, the sprocket SR, and the rotary shaft AR connected to the display unit DP can rotate in the clockwise direction. Further, the other end 172 of the elastic member 170 connected to the rotary shaft AR can also rotate in the clockwise direction.

In the meantime, when the rotary shaft AR rotates, energy stored in the elastic member 170 can be increased. When the other end 172 of the elastic member 170 moves together with the rotary shaft AR in the clockwise direction or the counterclockwise direction to move the display unit DP to the outside of the housing unit HP, the elastic member 170 can be wound therearound more. Therefore, the energy stored in the elastic member 170 can be increased. When the energy of the elastic member 170 is increased to a predetermined level or more, one end 171 of the elastic member 170 and the roller 160 connected to one end 171 of the elastic member 170 can rotate.

Specifically, the roller 160 is rotatably connected to the rotary shaft AR by means of the bearing BR to rotate independently from the rotary shaft AR. The rotary shaft AR, the sprocket SR, the chain 150, and the display unit DP which are connected to each other can rotate by the motor together. The roller 160 can rotate not by the motor, but by the elastic member 170. For example, the display unit DP and the roller 160 are rotated by different components so that a rotation angle of the roller 160 and a rotation angle of the display unit DP by the motor can be different for a predetermined time from the timing of driving the motor. Therefore, a distance that the display unit DP actually moves and a movement distance of the roller 160 to which one end of the display unit DP is fixed may not be equal for the same time. For example, since the display unit DP rotates by the motor and the roller 160 rotates by the elastic member 170, a movement distance of the display unit DP and a movement distance of the roller 160 fixed to the display unit DP through one end are different, for example, slip can occur. If the slip occurs, when the display unit DP is accommodated in the housing unit HP, the display unit DP can be loosened from the roller 160 without being in close contact with the roller 160.

Therefore, in the display device 100 according to the exemplary embodiment of the present disclosure, one end 171 and the other end 172 of the elastic member 170 are configured to be rotatable. Therefore, it is possible to generate a tensile stress which does not cause the damage to the display unit DP while compensating for the slip of the roller 160 and the display unit DP. Hereinafter, the elastic member 170 will be described in more detail with reference to FIGS. 11A to 13.

Figure 11A:
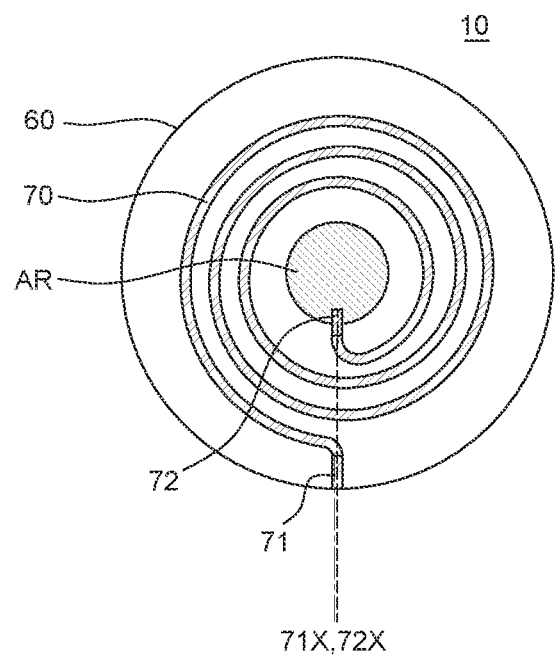
FIGS. 11A to 11C are views for explaining an elastic member of a display device according to Comparative Embodiment.
Figure 11B:
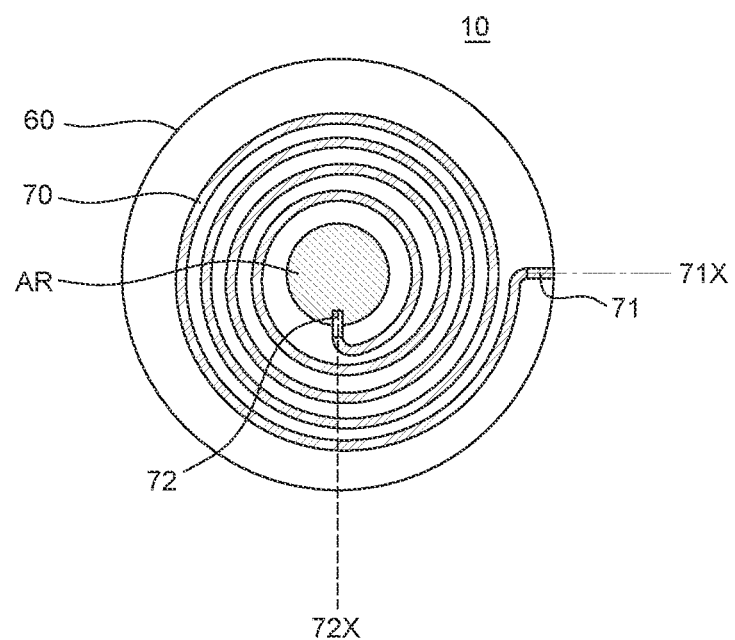
Figure 11C:
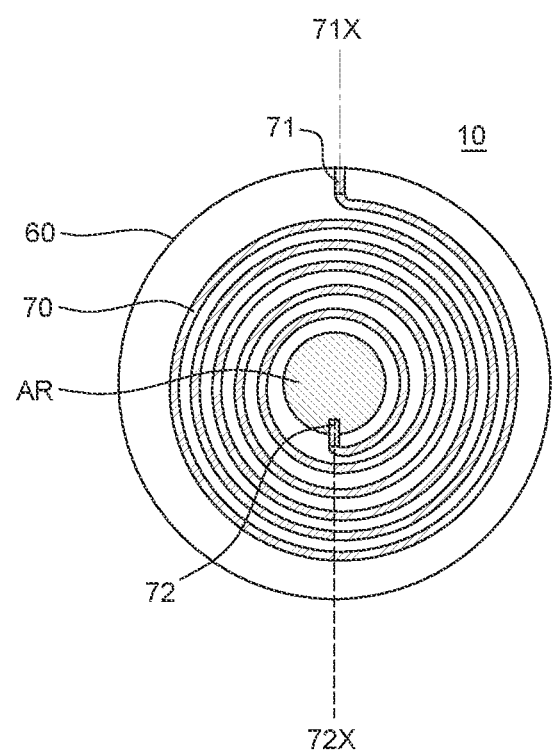
Figure 12A:
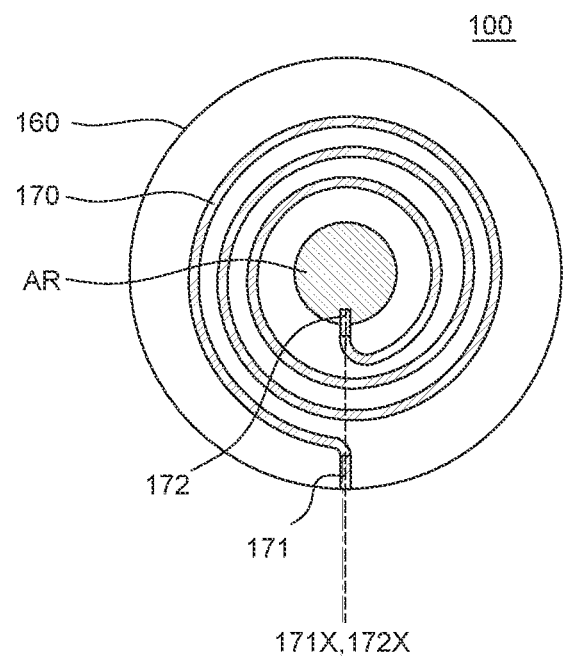
FIGS. 12A to 12C are views for explaining an elastic member of a display device according to Exemplary Embodiment.
Figure 12B:
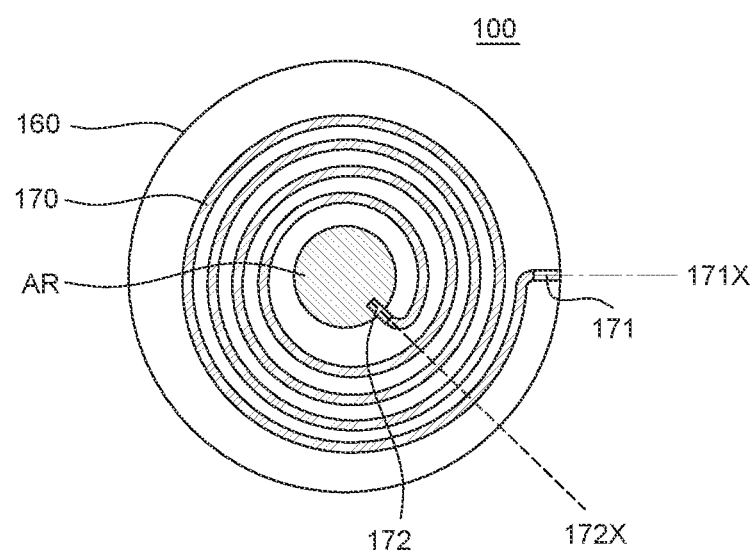
Figure 12C:
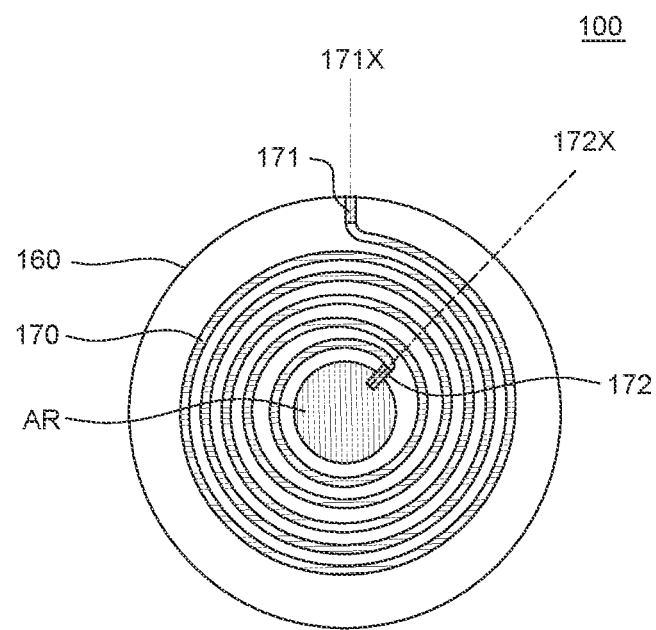
Figure 13:
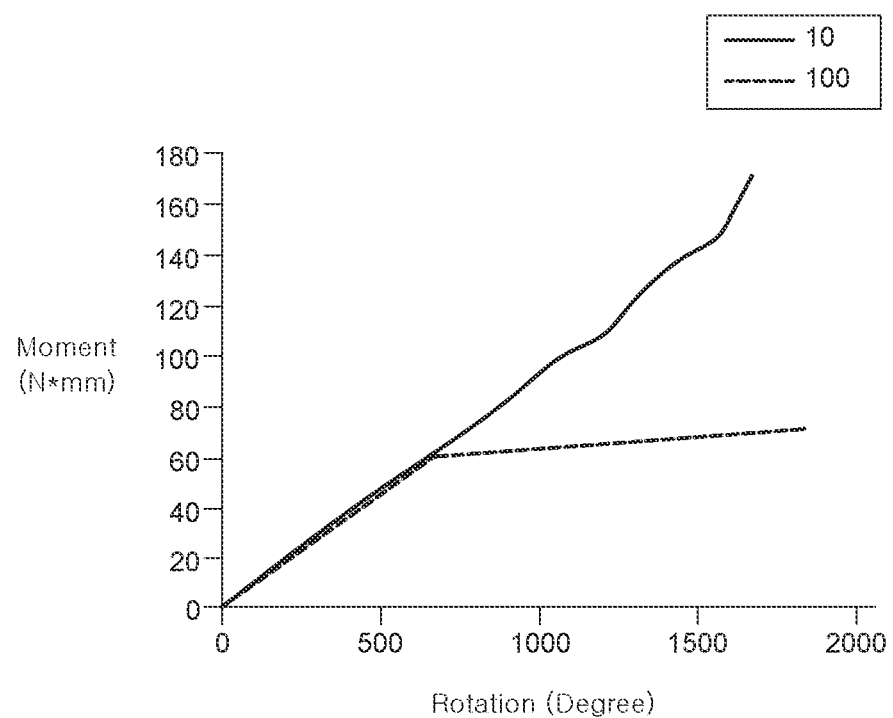
FIG. 13 is a graph illustrating a moment of an elastic member in accordance with a rotation angle of a roller in a display device according to Comparative Embodiment and Exemplary Embodiment.

FIGS. 11A to 11C are views for explaining an elastic member of a display device according to Comparative Embodiment. FIGS. 12A to 12C are views for explaining an elastic member of a display device according to Exemplary Embodiment. FIG. 13 is a graph illustrating a moment of an elastic member in accordance with a rotation angle of a roller in a display device according to Comparative Embodiment and Exemplary Embodiment.

A display device 10 according to Comparative Embodiment includes a cylindrical roller 60, a rotary shaft AR in the roller 60, and an elastic member 70 having one end 71 connected to the roller 60 and the other end 72 connected to the rotary shaft AR. In the display device 10 according to Comparative Embodiment, the rotary shaft AR is fixed and only the roller 60 is configured to be rotatable.

The display device 100 according to Exemplary Embodiment includes a cylindrical roller 160, a rotary shaft AR in the roller 160, and an elastic member 170 having one end 171 connected to the roller 160 and the other end 172 connected to the rotary shaft AR. The display device 100 according to Exemplary Embodiment and the display device 100 according to the exemplary embodiment of the present disclosure are substantially the same except that the roller 160 is cylindrical and the rotary shaft AR rotates by the rotation of the roller 160 in the display device 100 according to Exemplary Embodiment. In the display device 100 according to Exemplary Embodiment, the roller 160 is rotatably connected to the rotary shaft AR and the rotary shaft AR and the roller 160 can independently rotate. For example, both the rotary shaft AR and the roller 160 are configured to be rotatable.

First, referring to FIG. 11A, a central axis 71X of one end 71 of the elastic member 70 of the display device 10 according to Comparative Embodiment and a central axis 72X of the other end 72 of the elastic member 70 are disposed on the same line.

Referring to FIG. 11B, when the roller 60 rotates in a counterclockwise direction by 90 degrees, one end 71 of the elastic member 70 rotates in a counterclockwise direction by 90 degrees and the other end 72 of the elastic member 70 can be fixed in its original position. One end 71 of the elastic member 70 connected to the roller 60 rotates together with the roller 60 and the other end 72 of the elastic member 70 connected to the rotary shaft AR can be fixed to the same position as the other end 72 in FIG. 11A. Accordingly, a difference between an angle of the central axis 71X of one end 71 of the elastic member 70 and an angle of the central axis 72X of the other end 72 of the elastic member 70 can be 90 degrees. Therefore, the elastic member 70 can be wound around the rotary shaft AR more so that the energy stored in the elastic member 70 can be increased.

Referring to FIG. 11C, when the roller 60 further rotates in a counterclockwise direction by 90 degrees, one end of the elastic member 70 rotates in a counterclockwise direction by 90 degrees and the other end 72 of the elastic member 70 can be fixed in its original location. Accordingly, a difference between the central axis 71X of one end 71 of the elastic member 70 and the central axis 72X of the other end 72 of the elastic member 70 can be 180 degrees. Therefore, the elastic member 70 can be wound around the rotary shaft AR more so that the energy stored in the elastic member 70 can be increased.

Therefore, in the display device 10 according to Comparative Embodiment, only one end 71 of the elastic member 70 rotates while fixing the other end 72 of the elastic member 70 so that the more the roller 60 to which one end 71 of the elastic member 70 is connected rotates, the more the energy can be stored in the elastic member 70.

Referring to FIG. 12A, a central axis 171X of one end 171 of the elastic member 170 of the display device 100 according to Exemplary Embodiment and a central axis 172X of the other end 172 of the elastic member 170 are disposed on the same line.

Referring to FIG. 12B, when the roller 160 rotates in a counterclockwise direction, one end 171 of the elastic member 170 rotates in a counterclockwise direction by 90 degrees and the other end 172 of the elastic member 170 can rotate in the counterclockwise direction by approximately 45 degrees. One end 171 of the elastic member 170 connected to the roller 160 rotates together with the roller 160 and the other end 172 of the elastic member 170 connected to the rotary shaft AR can rotate as the energy stored in the elastic member 170 is increased to a predetermined level or higher. Specifically, when one end 171 of the elastic member 170 and the roller 160 start to rotate, the elastic member 170 can be wound around the rotary shaft AR more and the energy stored in the elastic member 170 can be increased more and more. The elastic member 170 can have a property to return to its original state when the elastic member 170 is deformed by the external force. Therefore, when one end 171 of the elastic member 170 rotates to deform the elastic member 170 by the external force applied to the roller 160, the other end 172 of the elastic member 170 can rotate in the same direction as one end 171 of the elastic member 170. By doing this, the elastic member 170 can return to its original state, for example, a state of FIG. 12A in which the central axis 171X of one end 171 of the elastic member 170 and the central axis 172X of the other end 172 of the elastic member 170 are disposed on the same line.

At this time, the other end 172 of the elastic member 170 does not rotate simultaneously with one end 171 of the elastic member 170, but can rotate when the energy stored in the elastic member 170 is increased to a predetermined level or higher. Specifically, the other end 172 of the elastic member 170 is fixed to the rotary shaft AR and a predetermined force is necessary to rotate the rotary shaft AR. Accordingly, after an additional energy which rotates the rotary shaft AR is stored in the elastic member 170, the other end 172 of the elastic member 170 and the rotary shaft AR can rotate together.

Referring to FIG. 12C, when the roller 160 further rotates in a counterclockwise direction by 90 degrees, one end 171 of the elastic member 170 further rotates in a counterclockwise direction by 90 degrees and the other end 172 of the elastic member 170 can rotate in the counterclockwise direction while maintaining a predetermined angle with one end 171 of the elastic member 170. A difference between the central axis 171X of one end 171 of the elastic member 170 connected to the roller 160 and the central axis 172X of the other end 172 of the elastic member 170 connected to the rotary shaft AR can be approximately 45 degrees. Even though one end 171 of the elastic member 170 and the roller 160 continuously rotate, the central axis 171X of one end 171 of the elastic member 170 and the central axis 172X of the other end 172 of the elastic member 170 maintain a predetermined level of angle difference. Therefore, the energy stored in the elastic member 170 can be maintained at a predetermined level.

Referring to FIG. 13, in the display device 10 according to Comparative Embodiment, one end 71 of the elastic member 70 rotates while fixing the other end 72 of the elastic member 70. Accordingly, the more the roller 60 rotates, the more the number of turns of the elastic member 70 wound around the rotary shaft AR. Accordingly, it is confirmed that as the rotation angle of one end 71 of the elastic member 70 which is the rotation angle of the roller 60 is increased, the moment of the elastic member 70 is gradually increased.

In the display device 100 according to Exemplary Embodiment, both one end 171 and the other end 172 of the elastic member 170 are configured to be rotatable. When the roller 160 and one end 171 of the elastic member 170 connected to the roller 160 start to rotate, the moment of the elastic member 170 can be gradually increased. At this time, when the rotation angle exceeds a predetermined value, for example, when one end 171 rotates by approximately 600 degrees or more, the rotary shaft AR connected to the other end 172 of the elastic member 170 can be rotated. Accordingly, when the moment of the elastic member 170 is equal to or larger than a predetermined level, the other end 172 of the elastic member 170 and the rotary shaft AR connected to the other end 172 of the elastic member 170 can rotate together toward one end 171 of the elastic member 170 by an elastic force which returns the elastic member 170 to its original state. Accordingly, even though the rotation angle of the roller 160 is increased, the moment of the elastic member 170 can be maintained to a similar level after a predetermined timing.

At this time, rotation speeds of one end 171 of the elastic member 170 and the other end 172 of the elastic member 170 are not completely equal, but can be maintained at a similar level. One end 171 of the elastic member 170 and the roller 160 and the other end 172 of the elastic member 170 and the rotary shaft AR are configured to individually rotate, so that the one end 171 of the elastic member 170 and the roller 160 rotate to increase the energy of the elastic member 170. Further, the other end 172 of the elastic member 170 and the rotary shaft AR rotate by the energy so that the movement speeds of one end 171 of the elastic member 170 and the other end 172 of the elastic member 170 can be slightly different. Accordingly, even though the rotation angle of the roller 160 is continuously increased, the moment of the elastic member 170 can be maintained to a similar level without being excessively increased.

In the display device 100 according to the exemplary embodiment of the present disclosure, one end 171 and the other end 172 of the elastic member 170 are connected to the roller 160 and the rotary shaft AR, respectively and the roller 160 and the rotary shaft AR are rotatably connected. By doing this, the slip of the roller 160 and the display unit DP can be compensated without applying excessive stress to the display unit DP. First, in the display device 100 according to the exemplary embodiment of the present disclosure, one end 171 of the elastic member 170 and the roller 160 rotate together and the other end 172 of the elastic member 170 and the rotary shaft AR rotate together. Therefore, an energy which compensates for the slip difference of the roller 160 and the display unit DP but does not cause the damage on the display DP can be stored in the elastic member 170.

For example, according to Comparative Embodiment, the other end 72 of the elastic member 70 is fixed and only one end 71 of the elastic member 70 continuously rotates so that the energy stored in the elastic member 70 can be continuously increased. In this case, the energy stored in the elastic member 70 is excessively increased to apply an unnecessary stress to the display unit DP. Therefore, when only one end 71 of the elastic member 70 rotates as described in Comparative Embodiment, the display unit DP can be damaged.

According to Exemplary Embodiment, both one end 171 and the other end 172 of the elastic member 170 are configured to be rotatable. When one end 171 of the elastic member 170 rotates, the other end 172 of the elastic member 170 can also rotate together after a predetermined level of energy is stored in the elastic member 170. One end 171 and the other end 172 of the elastic member 170 rotate together so that the energy stored in the elastic member 170 can be maintained at a predetermined level. At this time, the predetermined level of energy which is maintained in the elastic member 170 can compensate for the slip difference of the display unit DP and the roller 160 without causing the damage to the display unit DP.

Accordingly, in the display device 100 according to the exemplary embodiment of the present disclosure, the rotary shaft AR and the roller 160 are rotatably connected and both one end 171 and the other end 172 of the elastic member 170 are configured to be rotatable. By doing this, a tensile stress of the elastic member 170 can be maintained so as to compensate for the slip of the display unit DP and the roller 160 without causing the damage to the display unit DP.

In the display device 100 according to the exemplary embodiment of the present disclosure, the cover window CW extends to the outside of one end of the display panel 120 and the cover unit CP which covers the cover window CW is disposed to minimize the separation of the cover window CW from the display panel 120. If the cover unit CP is not disposed, one end of the cover window CW can be separated from the display panel 120 due to the repeated winding and unwinding of the display unit DP. Therefore, the cover window CW is formed to be longer than the display panel 120 and the cover unit CP which covers one end of the cover window CW is disposed to minimize the separation of the cover window CW from the display panel 120.

In the display device 100 according to the exemplary embodiment of the present disclosure, the mandrel MD in which the plurality of flexible films 130 and the printed circuit board 140 are seated is disposed to stably support the plurality of flexible films 130 and the printed circuit board 140 and easily connect the display unit DP to the roller 160. The plurality of flexible films 130 and the printed circuit board 140 are disposed to enclose the mandrel MD. Therefore, a part of the plurality of flexible films 130 and the printed circuit board 140 can be maintained in a flat state by the mandrel MD, regardless of the winding or unwinding of the display panel 120. Further, the display unit DP can be connected to the roller 160 by seating the mandrel MD enclosed by the plurality of flexible films 130, the printed circuit board 140, and the mid frame 110 in the seating portion 163 of the roller 160. Accordingly, in the display device 100 according to the exemplary embodiment of the present disclosure, the printed circuit board 140 and the plurality of flexible films 130 are disposed on the mandrel MD to minimize the damage due to the bending of the printed circuit board 140 and the plurality of flexible films 130. Further, the mandrel MD is seated on the roller 160 to easily connect the display unit DP to the roller 160.

Figure 14A:
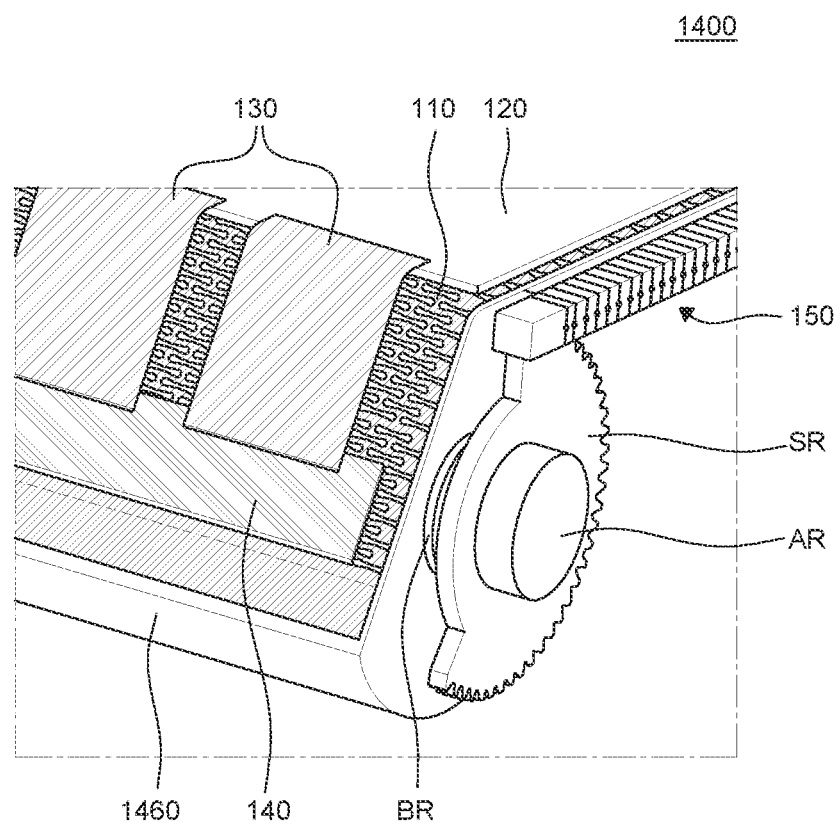
FIG. 14A is a perspective view of a display device according to another exemplary embodiment of the present disclosure.
Figure 14B:
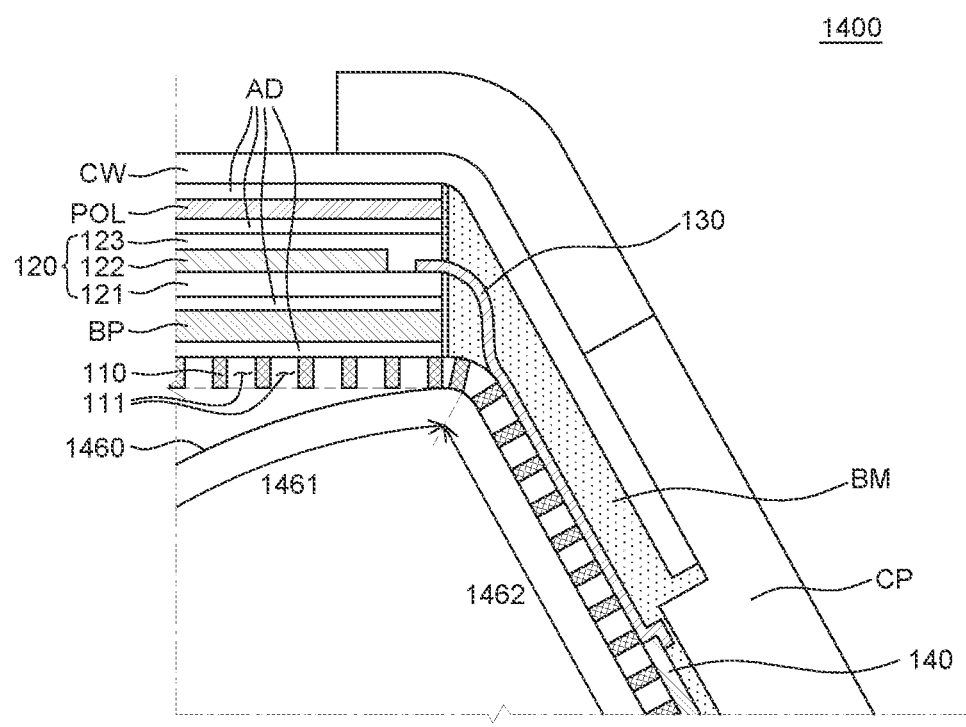
FIG. 14B is a cross-sectional view of a display device according to another exemplary embodiment of the present disclosure.

FIG. 14A is a perspective view of a display device according to another exemplary embodiment of the present disclosure. FIG. 14B is a cross-sectional view of a display device according to another exemplary embodiment of the present disclosure. As compared with the display device 100 of FIGS. 1 to 10, in a display device 1400 of FIGS. 14A and 14B, the mandrel MD is omitted and only a cover unit CP and a roller 1460 of a display unit DP are different, but other configurations are substantially the same, so that a redundant description will be omitted or may be briefly provided. For the convenience of description, in FIG. 14A, the cover window CW and the cover unit CP are not illustrated.

Referring to FIGS. 14A and 14B, the roller 1460 includes a flat portion 1462 and a curved portion 1461. The roller 1460 can include the curved portion 1461 around which the display panel 120 is wound and the flat portion 1462 extending from the curved portion 1461.

A part of the mid frame 110 is disposed on the flat portion 1462 of the roller 1460. The mid frame 110 protrudes from one end of the display panel 120 to be disposed on the flat portion 1462 of the roller 1460. The mid frame 110 can be fixed to the flat portion 1462 of the roller 1460. For example, the mid frame 110 and the flat portion 1462 of the roller 1460 can be fastened with each other by a fastening member such as a screw, but the fixing method of the mid frame 110 is not limited thereto.

The plurality of flexible films 130 connected to one end of the display panel 120 can be disposed on the flat portion 1462 of the roller 1460. The plurality of flexible films 130 can be disposed on the mid frame 110 in the flat portion 1462 of the roller 1460.

The printed circuit board 140 connected to the plurality of flexible films 130 can also be disposed on the flat portion 1462 of the roller 1460. The printed circuit board 140 can be disposed on the mid frame 110 in the flat portion 1462 of the roller 1460.

One end of a cover window CW protrudes from one end of the display panel 120 to extend to the flat portion 1462 of the roller 1460. A part of the cover window CW can be disposed on the plurality of flexible films 130 and the mid frame 110 in the flat portion 1462 of the roller 1460.

A cover unit CP which covers one end of the cover window CW, one end of the display panel 120, and one end of a back plate BP is disposed. The cover unit CP can be disposed to cover one end of the cover window CW, the plurality of flexible films 130, the printed circuit board 140, and the mid frame 110 in the flat portion 1462 of the roller 1460. The cover unit CP can be disposed to cover one ends of the display panel 120 and the back plate BP in the curved portion 1461 of the roller 1460. At this time, the cover unit CP can be fixed to the flat portion 1462 of the roller 1460. For example, the cover unit CP and the flat portion 1462 of the roller 1460 can be fastened with each other by a fastening member such as a screw, but the fixing method of the cover unit CP is not limited thereto.

In the display device 1400 according to another exemplary embodiment of the present disclosure, the cover unit CP, the printed circuit board 140, the plurality of flexible films 130, and the cover window CW are disposed on the flat portion 1462 of the roller 1460 to simplify the fastening structure of the display unit DP and the roller 1460. First, in order to fix the display unit DP to the roller 1460, the mid frame 110 can be formed to be longer than the display panel 120. A part of the mid frame 110 to which the display panel 120 is attached protrudes outwardly from the display panel 120 to be disposed on the flat portion 1462 of the roller 1460. As the mid frame 110 is fixed to the flat portion 1462 of the roller 1460, the display unit DP including the mid frame 110 can be fixed to the roller 1460. Accordingly, by extending the mid frame 110 without disposing a separate structure, the display unit DP can be easily fixed to the roller 1460 and the structure of the display device 1400 can be simplified.

In the display device 1400 according to another exemplary embodiment of the present disclosure, the plurality of flexible films 130 and the printed circuit board 140 are disposed on the flat portion 1462 of the roller 1460 to minimize the damage of the plurality of flexible films 130 and the printed circuit board 140. As a part of the mid frame 110 extending to the outside of one end of the display panel 120 is disposed on the flat portion 1462 of the roller 1460, the plurality of flexible films 130 and the printed circuit board 140 connected to one end of the display panel 120 can also be disposed on the flat portion 1462 of the roller 1460. Therefore, at least a part of the plurality of flexible films 130 and the printed circuit board 140 can be maintained in a flat state by the flat portion 1462 of the roller 1460, regardless of the winding or unwinding of the display panel 120. Accordingly, in the display device 1400 according to another exemplary embodiment of the present disclosure, the printed circuit board 140 and the plurality of flexible films 130 are disposed on the flat portion 1462 of the roller 1460 to minimize the damage of the printed circuit board 140 and the plurality of flexible films 130 due to the bending.

In the display device 1400 according to another exemplary embodiment of the present disclosure, the cover unit CP is disposed to cover one end of the cover window CW, one end of the display panel 120, and one end of the back plate BP. By doing this, the loosening of the cover window CW, the display panel 120, and the back plate BP from the other configuration of the display device 1400 due to the repeated winding and unwinding can be minimized. One end of the cover window CW protrudes outwardly from one end of the display panel 120 to be disposed on the flat portion 1462 of the roller 1460. If the cover unit CP is not disposed, as the display panel 120 is repeatedly bent, the end portion of the cover window CW is loosened from the display panel 120, which can cause the separation of the cover window CW from the display panel 120. Further, the display panel 120 and the back plate BP whose end portions are disposed on the curved portion 1461 of the roller 1460 are loosened from the other configuration of the display device 1400, for example, from the mid frame 110 to cause the damage to the display device 1400. In order to suppress this problem, the cover unit CP which covers one end of the cover window CW on the flat portion 1462 of the roller 1460 and covers one ends of the display panel 120 and the back plate BP on the curved portion 1461 is disposed and the cover unit CP is fixed to the roller 1460. By doing this, the loosening of the cover window CW, the display panel 120, and the back plate BP from the other configuration of the display device 1400 can be minimized. Further, the cover unit CP covers at least parts of the printed circuit board 140 and the plurality of flexible films 130 in addition to the cover window CW to protect the plurality of flexible films 130 and the printed circuit board 140 from the outside. Accordingly, in the display device 1400 according to another exemplary embodiment of the present disclosure, the cover unit CP is disposed to cover one end of the cover window CW, the plurality of flexible films 130, and the printed circuit board 140 on the flat portion 1462 of the roller 1460 and one ends of the display panel 120 and the back plate BP on the curved portion 1461. By doing this, the separation of the cover window CW, the display panel 120, and the back plate BP from the other configuration of the display device 1400 is minimized and the plurality of flexible films 130 and the printed circuit board 140 are protected from the outside.

Figure 15A:
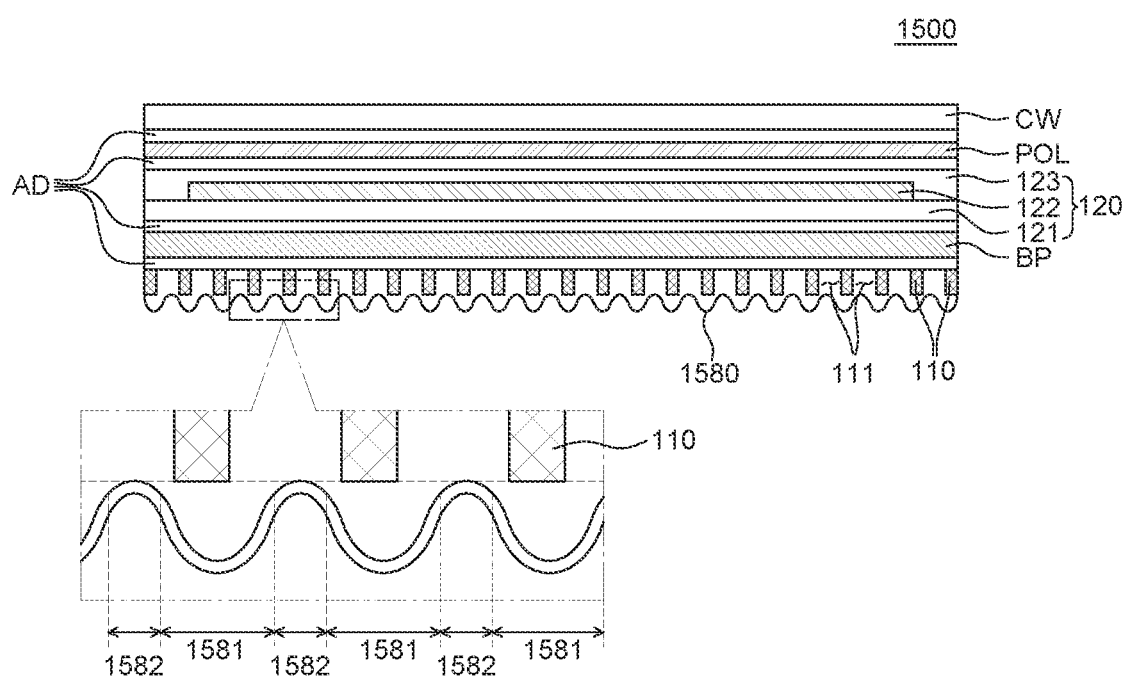
FIG. 15A is a cross-sectional view of a display device according to still another exemplary embodiment of the present disclosure.
Figure 15B:
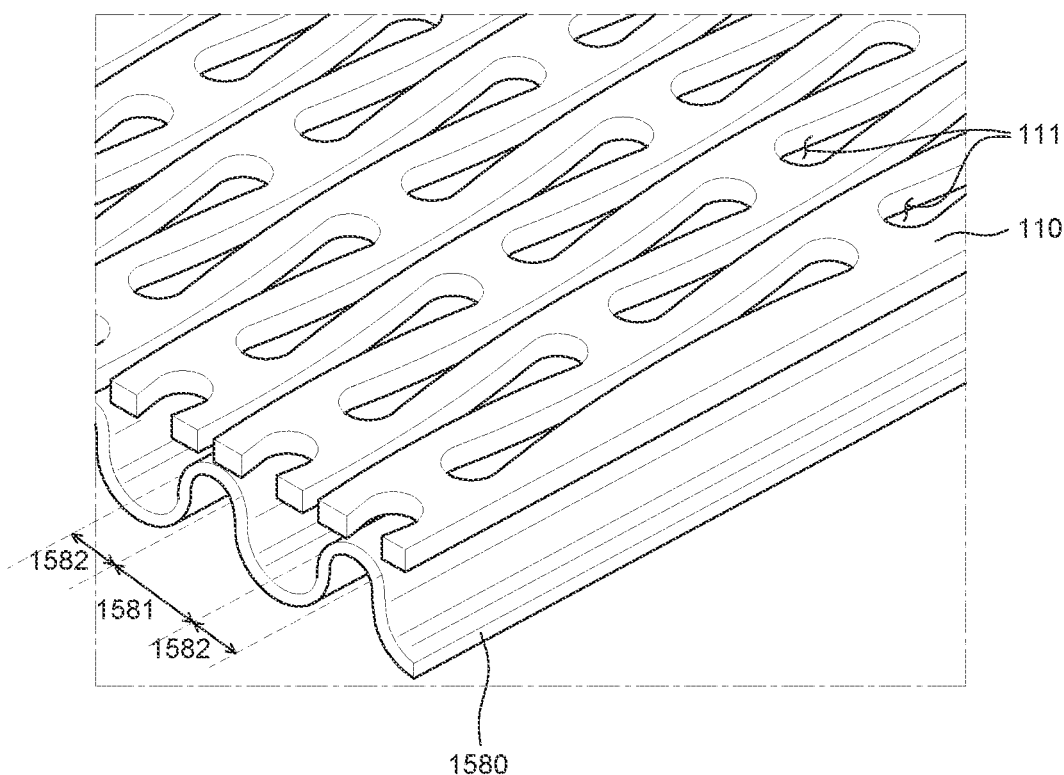
FIG. 15B is an enlarged perspective view of a mid frame and a support unit of a display device according to still another exemplary embodiment of the present disclosure.

FIG. 15A is a cross-sectional view of a display device according to still another exemplary embodiment of the present disclosure and FIG. 15B is an enlarged perspective view of a mid frame and a support unit of a display device according to still another exemplary embodiment of the present disclosure. As compared with the display device 100 of FIGS. 1 to 10, a display device 1500 of FIGS. 15A and 15B further includes a support unit 1580, but other configurations are substantially the same, so that a redundant description will be omitted or may be briefly provided.

Referring to FIGS. 15A and 15B, the support unit 1580 is disposed below the mid frame 110. The support unit 1580 is disposed on a rear surface of the mid frame 110 to support the mid frame 110 and the display panel 120. The support unit 1580 can be disposed below the mid frame 110 to be spaced apart from the chain 150 disposed on both sides of the display unit DP. For example, the support unit 1580 can be disposed below the mid frame 110 to overlap only an inner side of the mid frame 110. The support unit 1580 can be formed of a material having a flexibility to be bent together with the display panel 120 while supporting the mid frame 110 and the display panel 120. For example, the support unit 1580 can be formed of a metal material such as steel use stainless SUS or invar, plastic, or the like, but is not limited thereto.

The support unit 1580 includes a plurality of first parts 1581 and a plurality of second parts 1582.

The plurality of first parts 1581 of the support unit 1580 extends along a length direction of the roller 160 and is spaced apart from each other. For example, when the display unit DP is wound in a column direction, the plurality of first parts 1581 can extend in a row direction and when the display unit DP is wound in a row direction, the plurality of first parts 1581 can extend in a column direction. The plurality of first parts 1581 can be spaced apart from the mid frame 110. The plurality of first parts 1581 which is spaced apart from each other protrudes to the rear surface of the mid frame 110 to be spaced apart from the mid frame 110.

The plurality of second parts 1582 of the support unit 1580 extends along a length direction of the roller 160 and is disposed between the plurality of first parts 1581, respectively. The plurality of second parts 1582 can be connected to the mid frame 110. The plurality of second parts 1582 is in contact with the mid frame 110 to support the mid frame 110. The plurality of second parts 1582 can be fixed to the mid frame 110 using a thermal fusing method, but is not limited thereto.

A cross-sectional shape of the support unit 1580 configured by the plurality of first parts 1581 and the plurality of second parts 1582 can be a wave shape. For example, the cross-sectional shape of the plurality of first parts 1581 and the plurality of second parts 1582 can be a sinusoidal shape, but is not limited thereto.

In the display device 1500 according to still another exemplary embodiment of the present disclosure, the support unit 1580 is further disposed on the rear surface of the display unit DP to maintain the display unit DP to be flat while maintaining the flexibility of the display unit DP. When the display panel 120 is disposed at the outside of the housing unit HP, a separate structure can be further disposed on the rear surface of the display panel 120 to support the display panel 120 to be flat. However, depending on the type of the structure, the blemish may be visible from the front surface of the display panel 120 or a stress is applied to the display panel 120 which may cause damage to the display panel 120. For example, when a plurality of structures which is rotatably connected to be bent together with the display panel 120 is disposed on the rear surface of the display panel 120, boundary portions of the plurality of structures may be visible from the front surface of the display panel 120. For example, when a plate having a predetermined thickness is disposed on the rear surface of the display panel 120, a neutral plane of the display unit DP may vary due to the thickness of the plate, which may cause a crack or buckling of the display panel 120.

In contrast, in the display device 1500 according to still another exemplary embodiment of the present disclosure, the support unit 1580 which minimizes the contact with the display unit DP is disposed on the rear surface of the display unit DP to support the display unit DP without lowering the flexibility of the display unit DP. The support unit 1580 is configured by a plurality of first parts 1581 which extends in the length direction of the roller 160 and is spaced apart from each other and a plurality of second parts 1582 between the plurality of first parts 1581. The plurality of first parts 1581 and the plurality of second parts 1582 extend in a direction perpendicular to a winding direction of the display unit DP. For example, when the display unit DP is wound in the column direction, the plurality of first parts 1581 and the plurality of second parts 1582 extend in the row direction to support the display unit DP to be bent only in the row direction, but not to be bent in the column direction. For example, the support unit 1580 can enhance the rigidity of the display unit DP in the row direction. Further, a cross-sectional shape of the plurality of first parts 1581 and the plurality of second parts 1582 has a wave shape so that the plurality of first parts 1581 and the plurality of second parts 1582 can be easily bent so that the support unit 1580 does not lower the flexibility of the display unit DP.

Further, the plurality of first parts 1581 and the plurality of second parts 1582 are formed by one surface to have a minimum thickness to minimize the change of the neutral plane of the display unit DP.

Accordingly, in the display device 1500 according to still another exemplary embodiment of the present disclosure, the support unit 1580 having a wave-shaped cross-section is disposed on the rear surface of the display unit DP to support the display unit DP to be flat without interrupting the bending of the display unit DP.

The exemplary embodiments of the present disclosure can also be described as follows:

According to an aspect of the present disclosure, there is provided a display device. The display device includes a display panel, a roller which guides sliding of the display panel, a rotary shaft which passes through both ends of the roller, and an elastic member having one end connected to an inner circumferential surface of the roller and the other end connected to the rotary shaft. The roller and the rotary shaft are rotatably connected.

The display device can further include a sprocket fixed to the rotary shaft protruding from both ends of the roller; and a chain which is disposed on both sides of the display panel on a rear surface of the display panel and is configured to be engaged with the sprocket. The chain can be configured to be rotatable in a direction directed to the rear surface of the display panel.

The display device can further include a mid frame which supports the display panel on the rear surface of the display panel and has some of a plurality of edges protruding outwardly from the display panel, and a head bar which is fastened with the edge of the mid frame protruding outwardly from the display panel and the other end of the chain.

The display device can further include a plurality of flexible films which is connected to one end of the display panel, a mandrel which supports the display panel and the plurality of flexible films, a cover window which covers the entire display panel and a part of the plurality of flexible films, and a cover unit which is fastened with the mandrel with the cover window therebetween. The cover unit and the mandrel can be fastened by a fastening unit in areas between the plurality of flexible films.

The display device can further include a printed circuit board connected to the plurality of flexible films. The printed circuit board can be fixed to the mandrel by the fastening unit which fastens the cover unit and the mandrel.

The roller can be configured by a curved portion, a flat portion extending from one end of the curved portion, and a seating portion disposed between the other end of the curved portion and the flat portion and the mandrel can be seated in the seating portion such that the one end of the display panel is directed to the flat portion.

The roller can be configured by a curved portion around which the display panel is wound and a flat portion extending from one end of the curved portion. The display device can further include a plurality of flexible films which is connected to one end of the display panel to be disposed on the flat portion, a printed circuit board which is connected to the plurality of flexible films and is disposed on the flat portion, a cover window which covers the display panel and has one end extending to the flat portion, and a cover unit which is fastened with the flat portion with the cover window therebetween.

The display device can further include a motor which rotates the rotary shaft. When the rotary shaft and the other end of the elastic member fixed to the rotary shaft rotate in one direction by the motor, energy which is stored in the elastic member can be increased.

One end of the elastic member and the roller fixed to the one end of the elastic member can rotate in one direction by the energy stored in the elastic member.

The display device can further include a bearing which rotatably connects the roller and the rotary shaft. The rotary shaft can be rotated by the motor and the roller can be rotated by the elastic member.

The display device can further include a support unit which supports the display panel on a rear surface of the display panel. A cross-sectional shape of the support unit can be a wave shape.

According to another aspect of the present disclosure, there is provided a display device. The display device includes a display unit, a roller which is fastened with one end of the display unit, a rotary shaft which is rotatably connected to the roller and has a central axis which is the same as a central axis of the roller, an elastic member which is disposed in the roller, has one end connected to the roller and the other end connected to the rotary shaft, and a motor which rotates the rotary shaft. The roller rotates by the elastic member.

When the rotary shaft and the other end of the elastic member rotate in one direction by the motor, an additional energy can be stored in the elastic member and the one end of the elastic member and the roller connected to the one end of the elastic member can rotate in one direction by the additional energy.

The display device can further include a sprocket connected to the rotary shaft at both ends of the roller, a chain which is fixed to the sprocket through one end and is disposed on both sides of the display unit, and a head bar which fixes the other end of the chain and the other end of the display unit. The display unit can be wound around the roller and the chain can be wound around the sprocket.

The display unit can further include a display panel and when the display panel is fully wound around the roller, one end of the display panel and the other end of the display panel which enclose the roller can be spaced apart from each other.

The display unit can include a cover window which covers the display panel and has a part protruding outwardly from the display panel, a mid frame which supports the display panel on a rear surface of the display panel and has a part protruding outwardly from the display panel, one or more flexible films which are connected to the one end of the display panel, and a printed circuit board connected to the one or more flexible films, and the roller can be configured by a curved portion around which the display panel is wound and a flat portion extending from the curved portion.

A part of the cover window, a part of the mid frame, the one or more flexible films, and the printed circuit board can overlap the flat portion of the roller and a cover unit which covers the part of the cover window in the flat portion can be further included.

The cover unit can cover the one end of the display panel in the curved portion.

The display device can further include a mandrel which overlaps a part of the cover window, a part of the mid frame, the one or more flexible films, and the printed circuit board, and a cover unit which covers the part of the cover window and is fastened with the mandrel. The mandrel can be seated between the flat portion and the curved portion of the roller.

The display device can further include a support unit which supports the mid frame and the display panel on a rear surface of the mid frame. The support unit can include a plurality of first parts which extends along a length direction of the roller and is spaced apart from each other, and a plurality of second parts which is disposed between the plurality of first parts and is connected to the mid frame, and the plurality of first parts can be spaced apart from the mid frame.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure.

The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
a display panel;
a roller which guides sliding of the display panel;
a rotary shaft which passes through two ends of the roller;
an elastic member having one end connected to an inner circumferential surface of the roller and another end connected to the rotary shaft;
a plurality of flexible films which are connected to one end of the display panel;
a mandrel which supports the display panel and the plurality of flexible films;
a cover window which covers the entire display panel and a part of the plurality of flexible films in a direction viewed from the display panel; and
a cover unit which is fastened with the mandrel with the cover window therebetween,
wherein the roller and the rotary shaft are rotatably connected, and
wherein the cover unit and the mandrel are fastened by a fastening unit in areas between the plurality of flexible films.

2. The display device according to claim 1, further comprising:
a sprocket fixed to the rotary shaft protruding from the ends of the roller; and
a chain which is disposed on sides of the display panel on a rear surface of the display panel and is configured to be engaged with the sprocket,
wherein the chain is configured to be rotatable in a direction directed to the rear surface of the display panel.

3. The display device according to claim 2, further comprising:
- a mid frame which supports the display panel on the rear surface of the display panel and has some of a plurality of edges protruding outwardly from the display panel; and
- a head bar which is fastened with the edge of the mid frame protruding outwardly from the display panel and an end of the chain.

4. The display device according to claim 1, further comprising:
- a printed circuit board connected to the plurality of flexible films,
- wherein the printed circuit board is fixed to the mandrel by the fastening unit which fastens the cover unit and the mandrel.

5. The display device according to claim 1, wherein the roller is configured by a curved portion, a flat portion extending from one end of the curved portion, and a seating portion disposed between another end of the curved portion and the flat portion, and
- the mandrel is seated in the seating portion so that the one end of the display panel is directed to the flat portion of the roller.

6. The display device according to claim 1, wherein the roller is configured by a curved portion around which the display panel is wound and a flat portion extending from one end of the curved portion, and
the display device further comprises:
- a plurality of flexible films which is connected to one end of the display panel to be disposed on the flat portion of the roller;
- a printed circuit board which is connected to the plurality of flexible films and is disposed on the flat portion of the roller;
- a cover window which covers the display panel and has one end extending to the flat portion of the roller; and
- a cover unit which is fastened with the flat portion of the roller with the cover window therebetween.

7. The display device according to claim 1, further comprising:
- a motor which rotates the rotary shaft,
- wherein when the rotary shaft and the another end of the elastic member fixed to the rotary shaft rotate in one direction by the motor, energy which is stored in the elastic member is increased.

8. The display device according to claim 7, wherein one end of the elastic member and the roller fixed to the one end of the elastic member rotate in one direction by the energy stored in the elastic member.

9. The display device according to claim 7, further comprising:
- a bearing which rotatably connects the roller and the rotary shaft,
- wherein the rotary shaft is rotated by the motor and the roller is rotated by the elastic member.

10. The display device according to claim 1, further comprising:
- a support unit which supports the display panel on a rear surface of the display panel,
- wherein a cross-sectional shape of the support unit is a wave shape.

* * * * *